(12) United States Patent
Choi et al.

(10) Patent No.: US 11,984,446 B2
(45) Date of Patent: May 14, 2024

(54) SEMICONDUCTOR DEVICE WITH CAPACITORS HAVING DIFFERENT DIELECTRIC LAYER HEIGHTS

(71) Applicant: SK hynix Inc., Gyeonggi-do (KR)

(72) Inventors: Kyu Jin Choi, Gyeonggi-do (KR); Seong Min Ma, Gyeonggi-do (KR); Kyu Chan Shim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 17/565,248

(22) Filed: Dec. 29, 2021

(65) Prior Publication Data

US 2023/0024352 A1 Jan. 26, 2023

(30) Foreign Application Priority Data

Jul. 21, 2021 (KR) .................. 10-2021-0095796

(51) Int. Cl.
*H01L 27/08* (2006.01)
*H01L 49/02* (2006.01)

(52) U.S. Cl.
CPC .......... *H01L 27/0805* (2013.01); *H01L 28/60* (2013.01)

(58) Field of Classification Search
CPC . H01L 27/0805; H01L 28/60; H01L 27/0688; H01L 28/90
USPC ........................................................ 257/117
See application file for complete search history.

(56) References Cited

U.S. PATENT DOCUMENTS

| 6,140,201 A * | 10/2000 | Jenq | H01L 28/92 257/E21.267 |
| 2004/0157388 A1* | 8/2004 | Kim | H01L 28/91 257/532 |
| 2011/0042733 A1* | 2/2011 | Komeda | H10B 12/315 257/296 |
| 2015/0108607 A1* | 4/2015 | Chen | H01L 23/5228 257/533 |
| 2016/0155744 A1* | 6/2016 | Rhie | H10B 12/0335 257/296 |

FOREIGN PATENT DOCUMENTS

| KR | 10-0950752 B1 | 4/2010 |
| KR | 10-1589912 B1 | 2/2016 |

* cited by examiner

*Primary Examiner* — Duy T Nguyen
(74) *Attorney, Agent, or Firm* — IP & T GROUP LLP

(57) ABSTRACT

A semiconductor device may include a first capacitor and a second capacitor. The first capacitor may include a first lower electrode, a first upper electrode and a first dielectric layer disposed between the first lower electrode and the first upper electrode at a first height. The second capacitor may be positioned spaced apart from the first capacitor. The second capacitor may include a second lower electrode, a second upper electrode and a second dielectric layer disposed between the second lower electrode and the second upper electrode at a second height different from the first height.

9 Claims, 36 Drawing Sheets

SEMICONDUCTOR DEVICE WITH CAPACITORS HAVING DIFFERENT DIELECTRIC LAYER HEIGHTS

CROSS-REFERENCES TO RELATED APPLICATION

The present application claims priority under 35 U.S.C. § 119(a) to Korean Patent application number 10-2021-0095796, filed Jul. 21, 2021, in the Korean Intellectual Property Office, which is incorporated herein by reference in its entirety.

BACKGROUND

1. Technical Field

Various embodiments may generally relate to a semiconductor device and a method of manufacturing the same, more particularly, to a capacitor and a method of manufacturing the capacitor.

2. Related Art

Recently, a down-scaling of a semiconductor device may be rapidly progressed due to developments of electronic technologies. Thus, patterns in an electronic device have become finer. Further, in order to improve operational reliability of the semiconductor device, various structures and methods may be developed.

SUMMARY

In embodiments of the present disclosure, a semiconductor device may include a first capacitor and a second capacitor. The first capacitor may include a first lower electrode, a first upper electrode and a first dielectric layer disposed between the first lower electrode and the first upper electrode at a first height. The second capacitor may be positioned spaced apart from the first capacitor. The second capacitor may include a second lower electrode, a second upper electrode and a second dielectric layer disposed between the second lower electrode and the second upper electrode at a second height different from the first height.

In embodiments of the present disclosure, according to a method of manufacturing a semiconductor device, a 1-1 conductive pattern and a 1-2 conductive pattern may be formed through a first insulation layer. A second conductive pattern may electrically contact the 1-1 conductive pattern. The second conductive pattern may have a cylindrical shape including a closed lower surface and an opened upper surface. A first dielectric layer may be formed on the second conductive pattern. A second insulation layer may be formed on the first dielectric layer. A 3-1 conductive pattern and a 3-2 conductive pattern may be formed in the second insulation layer. The 3-1 conductive pattern may be configured to contact the first dielectric layer. The 3-2 conductive pattern may be configured to contact the 1-2 conductive pattern. A fourth conductive pattern may be formed on the second insulation layer. The fourth conductive pattern may be configured to electrically contact the 3-2 conductive pattern. The fourth conductive pattern may have a cylindrical shape including a closed lower surface and an opened upper surface. A second dielectric layer may be formed on the fourth conductive pattern. A third insulation layer may be formed on the second dielectric layer. A 5-1 conductive pattern and a 5-2 conductive pattern may be formed in the third insulation layer. The 5-1 conductive pattern may be configured to contact the 3-1 conductive pattern. The 5-2 conductive pattern may be configured to contact the second dielectric layer.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
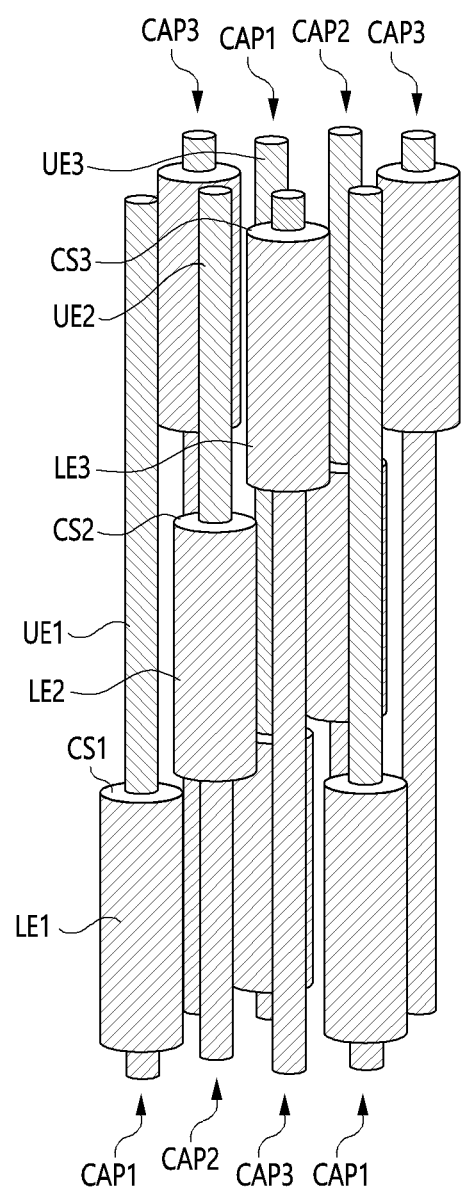
FIG. 1 is a perspective view illustrating a semiconductor device in accordance with various embodiments.
Figure 2A:
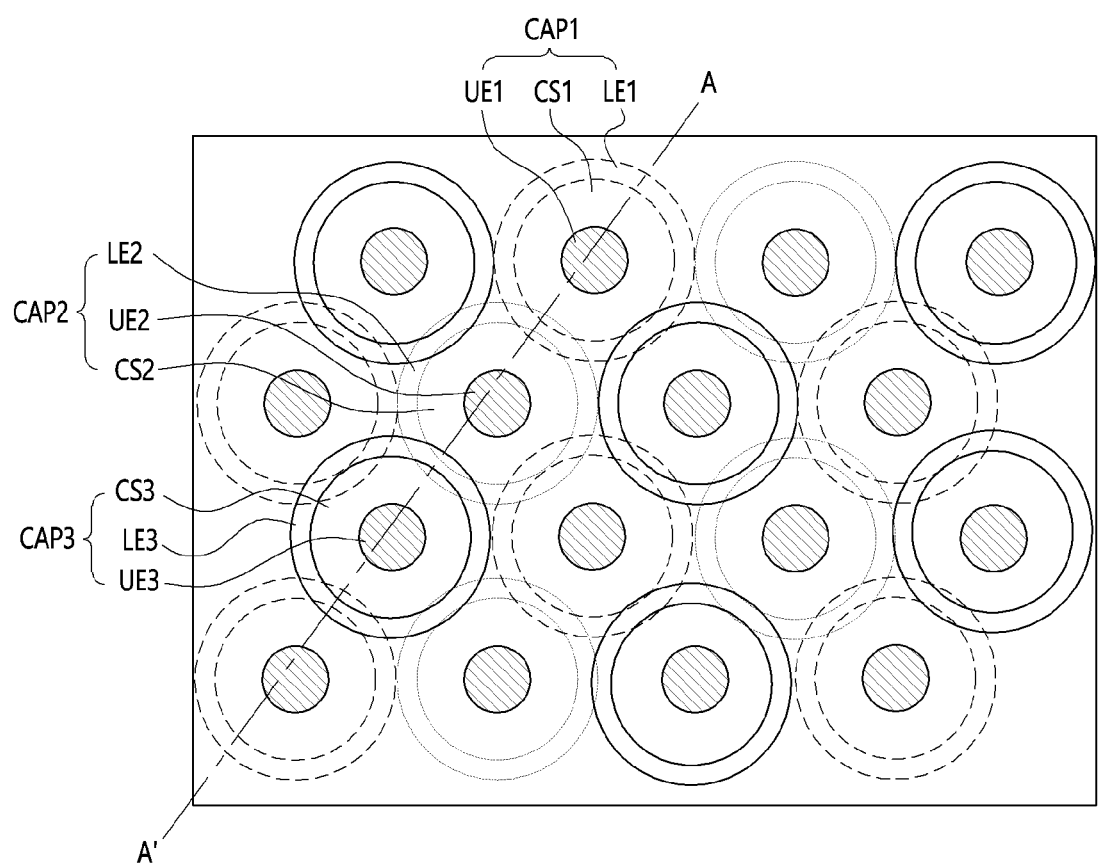
FIGS. 2A and 2B are views illustrating a semiconductor device in accordance with various embodiments.
Figure 2B:
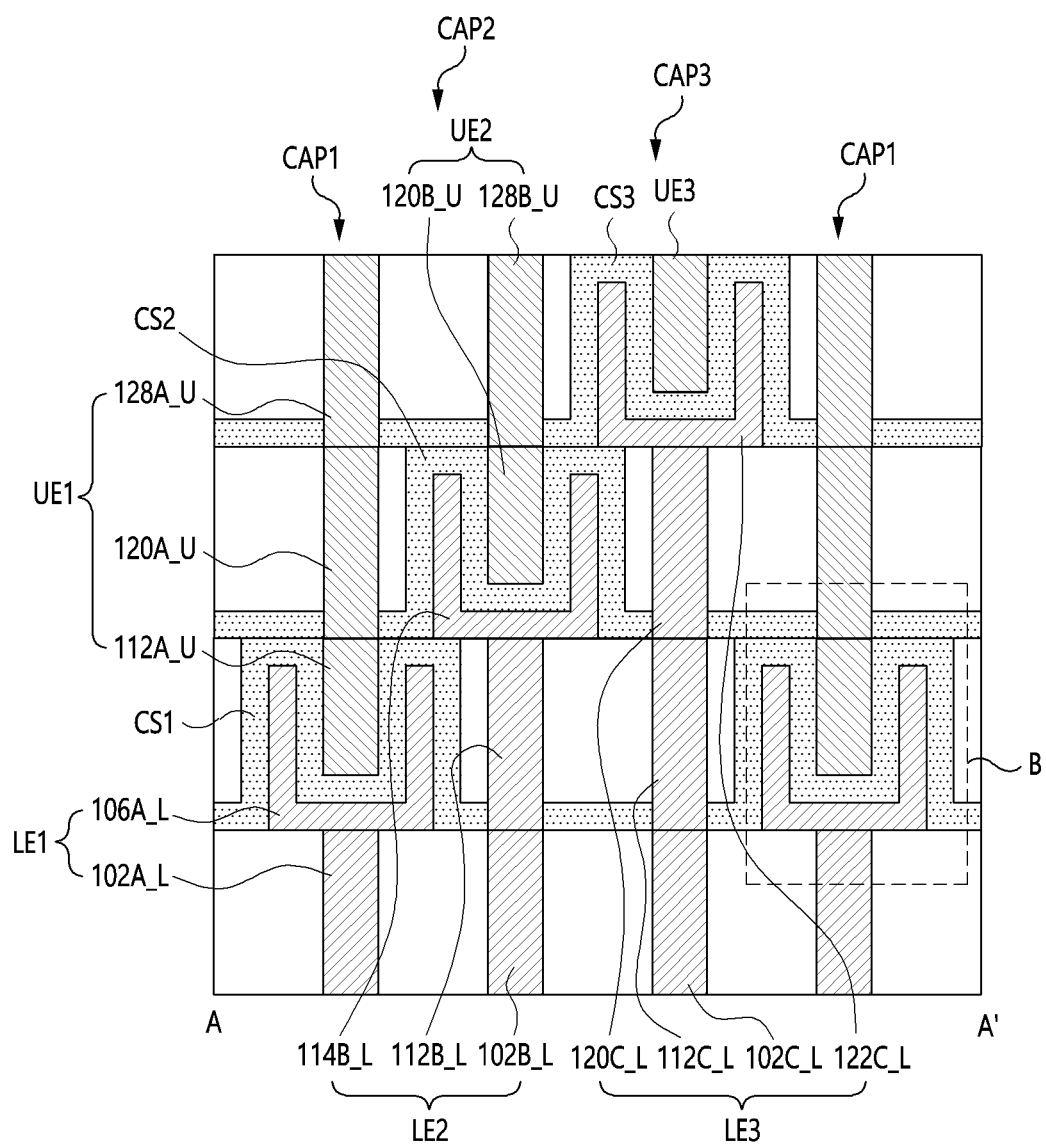

FIG. 1 is a perspective view illustrating a semiconductor device in accordance with various embodiments, and FIGS. 2A and 2B are views illustrating a semiconductor device in accordance with various embodiments. FIG. 2A is a plan view illustrating the semiconductor device in accordance with various embodiments. FIG. 2B is cross-sectional view taken along a line A-A' in FIG. 2A.

Referring to FIGS. 1, 2A and 2B, a semiconductor device may include a plurality of capacitors CAP1, CAP2 and CAP3.

Each of the capacitors CAP1, CAP2 and CAP3 may have a bar shape extended in a first direction. The capacitors CAP1, CAP2 and CAP3 may include lower electrodes LE1, LE2 and LE3, dielectric layers CS1, CS2 and CS3 and upper electrodes UE1, UE2 and UE3. The lower electrodes LE1, LE2 and LE3 may include polysilicon, metal, metal nitride, conductive metal oxide, a combination thereof, etc. For example, the lower electrodes LE1, LE2 and LE3 may include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$), a combination thereof, etc. The dielectric layers CS1, CS2 and CS3 may have a single-layered structure or a multi-layered structure. The dielectric layers CS1, CS2 and CS3 may include a material having a dielectric constant higher than silicon oxide. For example, the dielectric layers CS1, CS2 and CS3 may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), strontium titanium oxide ($SrTiO_3$), etc. The upper electrodes UE1, UE2 and UE3 may include (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$), a combination thereof, etc.

In the various embodiments, the capacitors CAP1, CAP2 and CAP3 may be classified into a first capacitor CAP1, a second capacitor CAP2 and a third capacitor CAP3 in accordance with positions of the dielectric layers. The first capacitor CAP1 may include a first dielectric layer CS1 corresponding to a lower layer. The second capacitor CAP2 may include a second dielectric layer CS2 corresponding to a middle layer. The third capacitor CAP3 may include a third dielectric layer CS3 corresponding to an upper layer.

The capacitors CAP1, CAP2 and CAP3 may be spaced apart from each other along a second direction and a third direction. The second and third directions may be perpendicular to each other and both directions may be perpendicular to the first direction. In the various embodiments, a plurality of the first capacitors CAP1, a plurality of the second capacitors CAP2 and a plurality of third capacitors CAP3 may be spaced apart from each other along the second direction and the third direction. For example, the first capacitor CAP1, the second capacitor CAP2 and the third capacitor CAP3 in a first row may be alternately arranged by a uniform gap along the second direction. The first capacitor CAP1, the second capacitor CAP2 and the third capacitor CAP3 in a second row may be alternately arranged by a uniform gap along the second direction. The third capacitor CAP3 in the second row may be arranged to fill a space between the first capacitor CAP1 and the second capacitor CAP2 in the first row. The first capacitor CAP1 in the second row may be arranged to fill a space between the second capacitor CAP2 and the third capacitor CAP3 in the first row. The second capacitor CAP2 in the second row may be arranged to fill a space between the third capacitor CAP3 and the first capacitor CAP1 in the first row.

A position and an order of the capacitors CAP1, CAP2 and CAP3 in a third row may be substantially the same as the position and the order of the capacitors CAP1, CAP2 and CAP3 in the first row. The first capacitor CAP1 may include the first lower electrode LE1, the first dielectric layer CS1 and the first upper electrode UE1. The first lower electrode LE1 may include a first portion 102A_L having a bar shape and a second portion 106A_L having a cylindrical shape including a closed lower surface and an open upper surface. The first upper electrode UE1 may include a first portion 112A_U having a bar shape, a second portion 120A_U having a bar shape and a third portion 128A_U having a bar shape. The first portion 112A_U of the first upper electrode UE1 may be extending centrally into the second portion 106A_L of the first lower electrode LE1 without touching the walls of the second portion 106A_L. The first dielectric layer CS1 may be arranged to fill a space between the second portion 106A_L of the first lower electrode LE1 and the first portion 112A_U of the first upper electrode UE1.

The second capacitor CAP2 may include the second lower electrode LE2, the second dielectric layer CS2 and the second upper electrode UE2. The second lower electrode LE2 may include a first portion 102B_L having a bar shape, a second portion 112B_L having a bar shape and a third portion 114B_L having a cylindrical shape including a closed lower surface and an open upper surface. The first portion 102B_L of the second lower electrode LE2 may have a height substantially the same as a height of the first portion 102A_L of the first lower electrode LE1. The second upper electrode UE2 may include a first portion 120B_U having a bar shape and a second portion 128B_U having a bar shape. The second portion 128B_U of the second upper electrode UE2 may have a height substantially the same as a height of the third portion 128A_U of the first upper electrode UE1. The first portion 120B_U of the second upper electrode UE2 may be extending centrally into the third portion 114B_L of the second lower electrode LE2. The second dielectric layer CS2 may be arranged to fill a space between the third portion 114B_L of the second lower electrode LE2 and the first portion 120B_U of the second upper electrode UE2.

The third capacitor CAP3 may include the third lower electrode LE3, the third dielectric layer CS3 and the third upper electrode UE3. The third lower electrode LE3 may include a first portion 102C_L having a bar shape, a second portion 112C_L having a bar shape, a third portion 120C_L having a bar shape and a fourth portion 122C_L having a cylindrical shape including a closed lower surface. The first portion 102C_L of the third lower electrode LE3 may have a height substantially the same as the height of the first portion 102A_L of the first lower electrode LE1 and the height of the first portion 102B_L of the second lower electrode LE2. The second portion 112C_L of the third lower electrode LE3 may have a height substantially the same as the height of the second portion 112B_L of the second lower electrode LE2. The third upper electrode UE3 may have only one portion in a bar shape which extends centrally into the fourth portion 122C_L of the third lower electrode LE3. The third dielectric layer CS3 may be arranged to fill a space between the fourth portion 122C_L of the third lower electrode LE3 and the bar shape portion of the third upper electrode UE3.

In a planar view as shown in FIG. 2A, the cylindrical second portion 106A_L of the first lower electrode LE1 may be partially overlapped with the cylindrical third portion 114B_L of the second lower electrode LE2. Further, the cylindrical second portion 106A_L of the first lower electrode LE1 may be partially overlapped with the cylindrical fourth portion 122C_L of the third lower electrode LE3. However, in a cross-sectional view, because the second portion 106A_L of the first lower electrode LE1, the third portion 114B_L of the second lower electrode LE2 and the fourth portion 122C_L of the third lower electrode LE3 may be positioned on different levels, the second portion 106A_L of the first lower electrode LE1, the third portion 114B_L of the second lower electrode LE2 and the fourth portion 122C_L of the third lower electrode LE3 may not electrically contact each other. Thus, a distance between the first capacitor CAP1, the second capacitor CAP2 and the third capacitor CAP3 may be reduced to provide the semiconductor device with a higher integration degree.

FIGS. 3A to 3H are cross-sectional views illustrating capacitors in accordance with various embodiments. FIGS. 3A to 3H are enlarged views of a portion "B" in FIG. 2B to show various structures of an upper electrode, a dielectric layer, and a lower electrode.

Figure 3A:
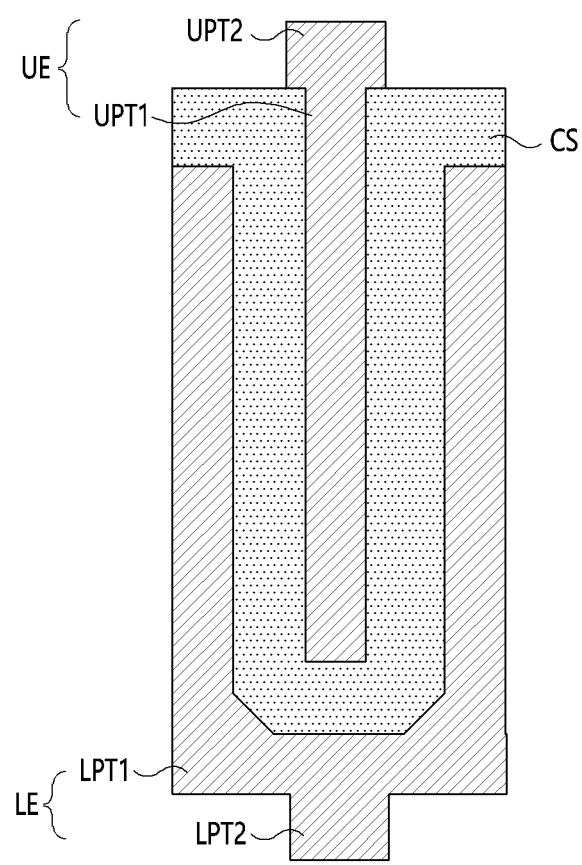
FIGS. 3A to 3H are cross-sectional views illustrating capacitors in accordance with various embodiments.

Referring to FIG. 3A, a lower electrode LE may include a first portion LPT1 and a second portion LPT2. The first portion LPT1 may have a cylindrical shape including a closed lower surface and an opened upper surface. The second portion LPT2 may have a bar shape downwardly protruding from the first portion LPT1. An upper electrode UE may include a first portion UPT1 and a second portion UPT2. The first portion UPT1 may have a bar shape extended into the first portion LPT1 of the lower electrode LE. The second portion UPT2 may be upwardly protruded. The second portion UPT2 may have a width (or diameter) larger than a width (or diameter) of the first portion UPT1. A dielectric layer CS may be arranged to fill a space between the first portion LPT1 of the lower electrode LE and the first portion UPT1 of the upper electrode UE.

Figure 3B:
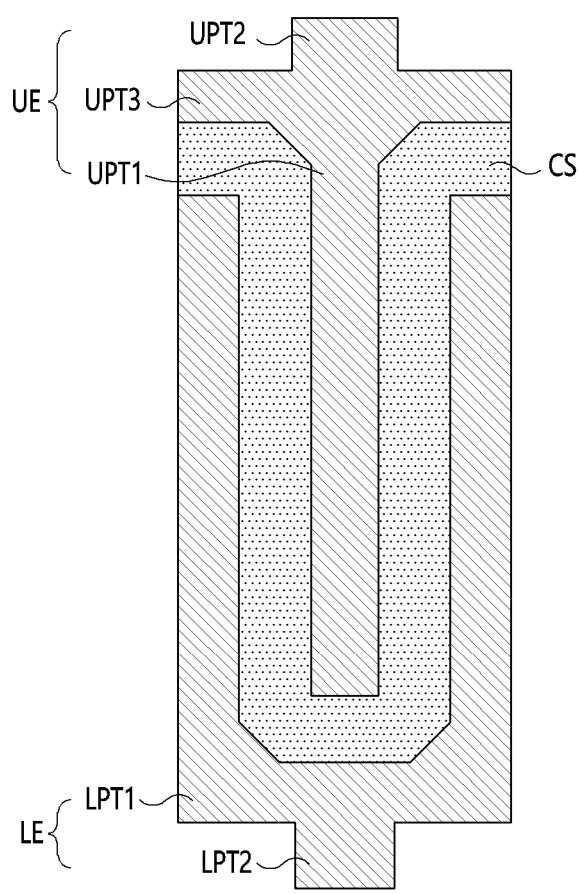

Referring to FIG. 3B, a lower electrode LE may have a structure substantially the same as the structure of the lower electrode LE in FIG. 3A. An upper electrode UE may include a first portion UPT1, a second portion UPT2 and a third portion UPT3. The first portion UPT1 may have a bar shape extended into the first portion LPT1 of the lower electrode LE. The second portion UPT2 may have a width (or diameter) larger than a width (or diameter) of the first portion UPT1. The second portion UPT2 may be upwardly protruded from a central portion of the top surface of the third portion UPT3. The third portion UPT3 may have a disc shape arranged between the first portion UPT1 and the second portion UPT2. A dielectric layer CS may be arranged to fill a space between the first portion LPT1 of the lower electrode LE and the first and third portions UPT1 and UPT3 of the upper electrode UE.

Figure 3C:
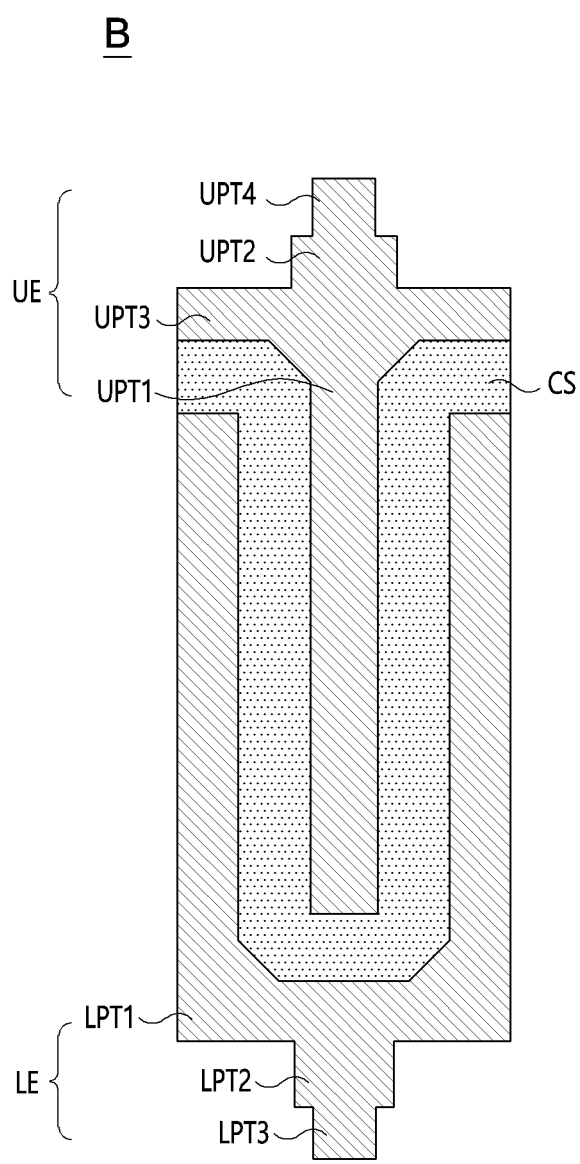

Referring to FIG. 3C, a lower electrode LE may include a first portion LPT1, a second portion LPT2 and a third portion LPT3. The first portion LPT1 may have a cylindrical shape including a closed lower surface and an opened upper surface. The second portion LPT2 may be downwardly protruded from a central portion of the bottom surface of the first portion LPT1. The third portion LPT3 may be downwardly protruded from a central portion of the bottom surface of the second portion LPT2. The third portion LPT3 may have a diameter smaller than a diameter of the second portion LPT2. An upper electrode UE may include a first portion UPT1, a second portion UPT2, a third portion UPT3 and a fourth portion UPT4. The first portion UPT1 may have a bar shape extended into the first portion LPT1 of the lower electrode LE. The second portion UPT2 may have a width (or diameter) larger than a width (or diameter) of the first portion UPT1. The second portion UPT2 may be upwardly protruded from a central portion of the top surface of the third portion UPT3. The third portion UPT3 may have a disc shape arranged between the first portion UPT1 and the second portion UPT2. The fourth portion UPT4 may be upwardly protruded from a central portion of the top surface of the second portion UPT2. The fourth portion UPT4 may have a diameter smaller than a diameter of the second portion UPT2. A dielectric layer CS may be arranged to fill a space between the first portion LPT1 of the lower electrode LE, and the first portion UPT1 and the third portion UPT3 of the upper electrode UE.

Figure 3D:
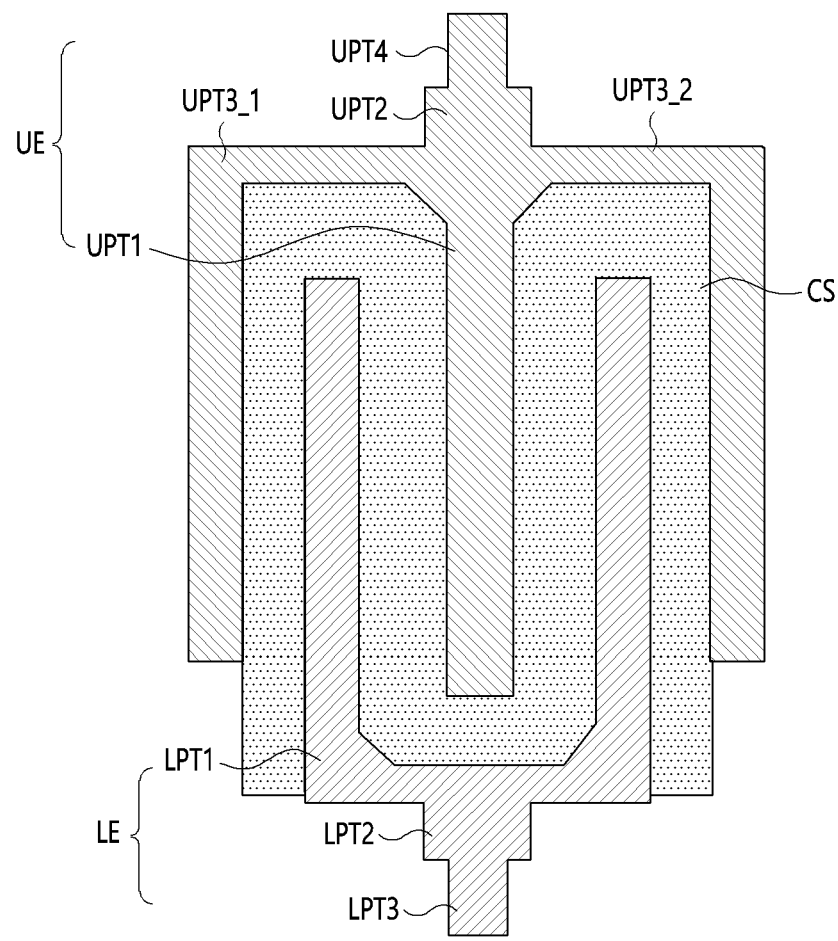

Referring to FIG. 3D, a lower electrode LE may include a first portion LPT1, a second portion LPT2 and a third portion LPT3. The first portion LPT1 may have a cylindrical shape including a closed lower surface and an opened upper surface. The second portion LPT2 may be downwardly protruded from a central portion of the bottom surface of the first portion LPT1. The third portion LPT3 may be downwardly protruded from a central portion of the bottom surface of the second portion LPT2. The third portion LPT3 may have a diameter smaller than a diameter of the second portion LPT2. An upper electrode UE may include a first portion UPT1, a second portion UPT2, a third portion UPT3_1 and UPT3_2 and a fourth portion UPT4. The first portion UPT1 may have a bar shape extended into the first portion LPT1 of the lower electrode LE. The second portion UPT2 may have a width (or diameter) larger than a width (or diameter) of the first portion UPT1. The second portion UPT2 may be upwardly protruded from a central portion of the top surface of the third portion UPT3_1 and UPT3_2. The third portion UPT3_1 and UPT3_2 may be arranged between the first portion UPT1 and the second portion UPT2. The fourth portion UPT4 may be upwardly protruded from a central portion of the top surface of the second portion UPT2. The fourth portion UPT4 may have a diameter smaller than a diameter of the second portion UPT2. The third portion UPT3_1 and UPT3_2 of the upper electrode UE may have a cylindrical shape including a closed upper surface and an opened lower surface. The first portion LPT1 of the lower electrode LE may be arranged to extend in the third portion UPT3_1 and UPT3_2 of the upper electrode UE. A dielectric layer CS may be formed in a space defined by the first portion LPT1 of the lower electrode LE and the third portion UPT3_1 and UPT3_2 of the upper electrode UE.

Figure 3E:
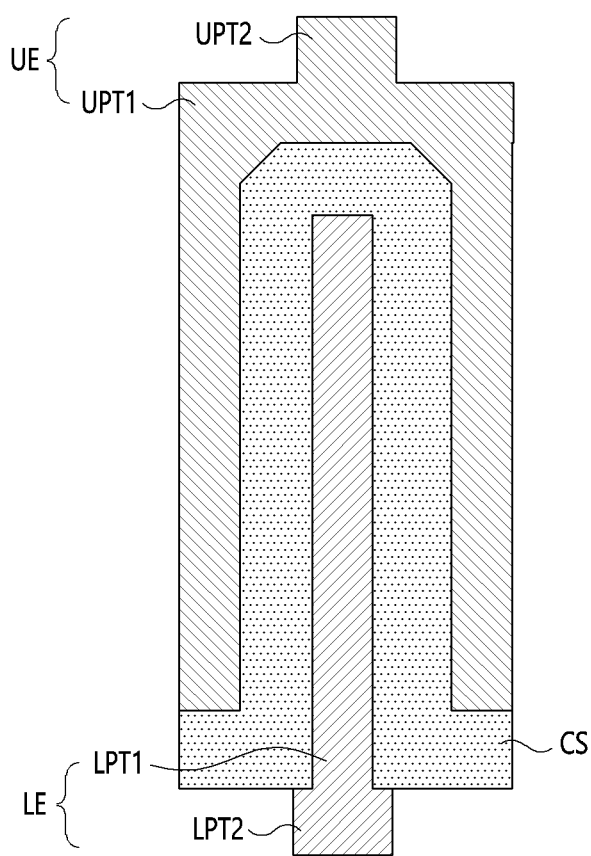

Referring to FIG. 3E, an upper electrode UE may include a first portion UPT1 and a second portion UPT2. The first portion UPT1 may include a closed upper surface and an opened lower surface. The second portion UPT2 may be upwardly protruded from a central portion of the top surface of the first portion UPT1. A lower electrode LE may include a first portion LPT1 and a second portion LPT2. The first portion LPT1 may have a bar shape extended into the first portion UPT1 of the upper electrode UE. The second portion LPT2 may have a width (or diameter) larger than a width (or diameter) of the first portion LPT1. The second portion LPT2 may be downwardly protruded from a central portion of the bottom surface of the first portion LPT1. A dielectric layer CS may be arranged to fill a space between the first portion LPT1 of the lower electrode LE and the first portion UPT1 of the upper electrode UE.

Figure 3F:
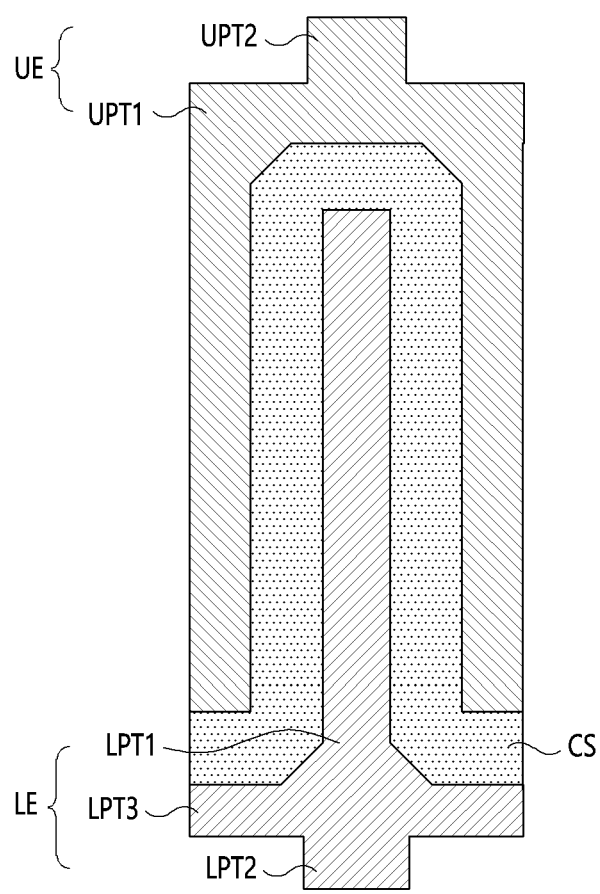

Referring to FIG. 3F, an upper electrode UE may have a structure substantially the same as the structure of the upper electrode UE in FIG. 3E. A lower electrode LE may include a first portion LPT1, a second portion LPT2 and a third portion LPT3. The first portion LPT1 may have a bar shape extended into the first portion UPT1 of the upper electrode UE. The second portion LPT2 may have a width (or diameter) larger than a width (or diameter) of the first portion LPT1. The second portion LPT2 may be downwardly protruded from a central portion of the bottom surface of the third portion LPT3. The third portion LPT3 may have a disc shape arranged between the first portion LPT1 and the second portion LPT2. A dielectric layer CS may be arranged to fill a space between the first portion UPT1 of the upper electrode UE and the first portion LPT1 and the third portion LPT3 of the lower electrode LE.

Figure 3G:
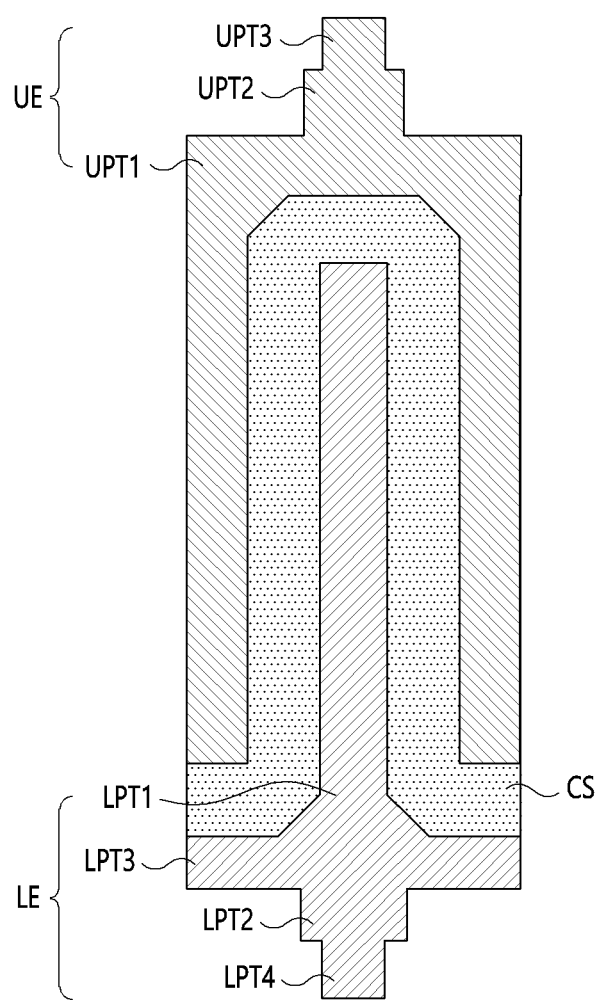

Referring to FIG. 3G, an upper electrode UE may include a first portion UPT1, a second portion UPT2 and a third portion UPT3. The first portion UPT1 may have a cylindrical shape including a closed upper surface and an opened lower surface. The second portion UPT2 may be upwardly protruded from a central portion of the top surface of the first portion UPT1. The third portion UPT3 may be upwardly protruded from a central portion of the top surface of the second portion UPT2. The third portion UPT3 may have a diameter smaller than a diameter of the second portion UPT2. A lower electrode LE may include a first portion LPT1, a second portion LPT2, a third portion LPT3 and a fourth portion LPT4. The first portion LPT1 may have a bar shape extended into the first portion UPT1 of the upper electrode UE. The second portion LPT2 may have a width (or diameter) larger than a width (or diameter) of the first portion LPT1. The second portion LPT2 may be downwardly protruded from a central portion of the bottom surface of the third portion LPT3. The third portion LPT3 may have a disc shape arranged between the first portion LPT1 and the second portion LPT2. The fourth portion LPT4 may be downwardly protruded from a central portion of the bottom surface of the second portion LPT2. The fourth portion LPT4 may have a diameter smaller than a diameter of the second portion LPT2. A dielectric layer CS may be arranged to fill a space between the first portion UPT1 of the upper electrode UE and the first portion LPT1 and the third portion LPT3 of the lower electrode LE.

Figure 3H:
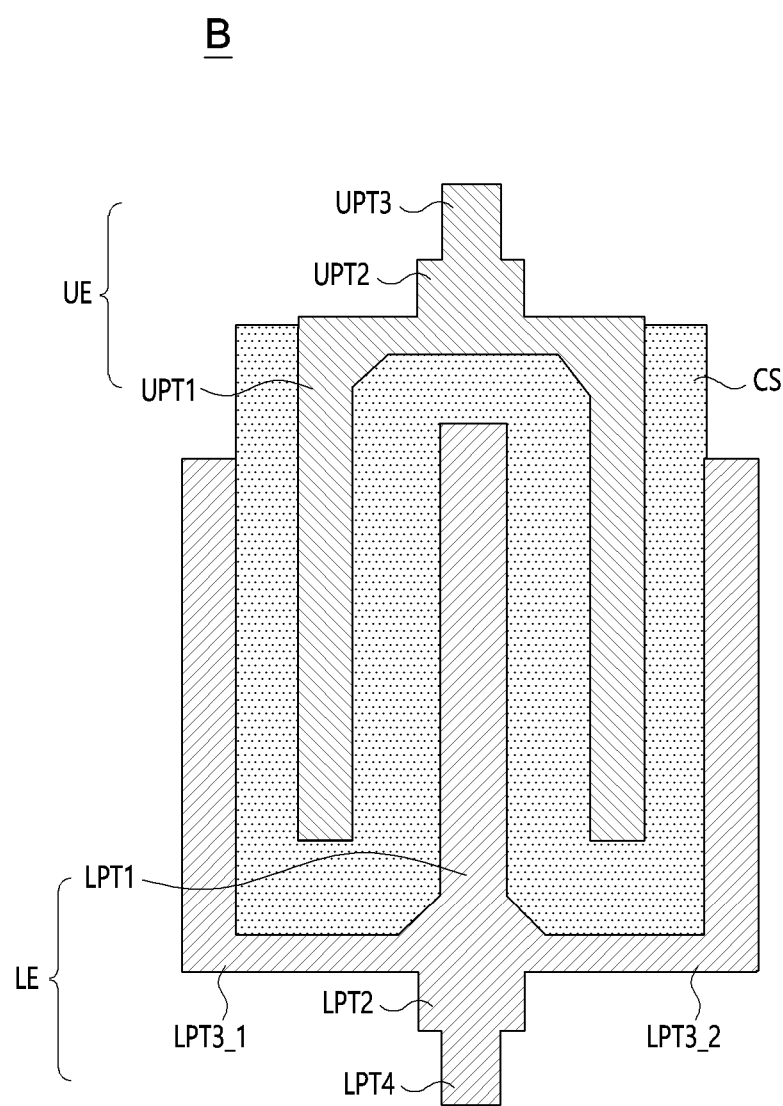

Referring to FIG. 3H, an upper electrode UE may include a first portion UPT1, a second portion UPT2 and a third portion UPT3. The first portion UPT1 may have a cylindrical shape including a closed upper surface and an opened lower surface. The second portion UPT2 may be upwardly protruded from a central portion of the top surface of the first portion UPT1. The third portion UPT3 may be upwardly protruded from a central portion of the top surface of the second portion UPT2. The third portion UPT3 may have a diameter smaller than a diameter of the second portion UPT2. A lower electrode LE may include a first portion LPT1, a second portion LPT2, a third portion LPT3_1 and LPT3_2 and a fourth portion LPT4. The first portion LPT1 may have a bar shape extended into the first portion UPT1 of the upper electrode UE. The second portion LPT2 may have a width (or diameter) larger than a width (or diameter) of the first portion LPT1. The second portion LPT2 may be downwardly protruded from a central portion of the bottom surface of the third portion LPT3_1 and LPT3_2. The third portion LPT3_1 and LPT3_2 may be arranged between the first portion LPT1 and the second portion LPT2. The fourth portion LPT4 may be downwardly protruded from a central portion of the bottom surface of the second portion LPT2. The fourth portion LPT4 may have a diameter smaller than a diameter of the second portion LPT2. The third portion LPT3_1 and LPT3_2 of the lower electrode LE may have a cylindrical shape including a closed lower surface and an opened upper surface. The first portion UPT1 of the upper electrode UE may be arranged to extend in the third portion LPT3_1 and LPT3_2 of the lower electrode LE. A dielectric layer CS may be formed in a space defined by the first portion UPT1 of the upper electrode UE and the third portion LPT3_1 and LPT3_2 of the lower electrode LE.

In the various embodiments, the capacitors may have various structures, not limited within the above-mentioned structures.

Hereinafter, a method of manufacturing a semiconductor device including the capacitors in accordance with embodiments may be illustrated in detail.

FIGS. 4A to 4L are plan views illustrating a method of forming capacitors in accordance with various embodiments, and FIGS. 5A to 5L are cross-sectional views illustrating a method of forming capacitors in accordance with various embodiments. FIGS. 5A to 5L are cross-sectional views taken along a line A-A' in FIGS. 4A to 4L.

Figure 4A:
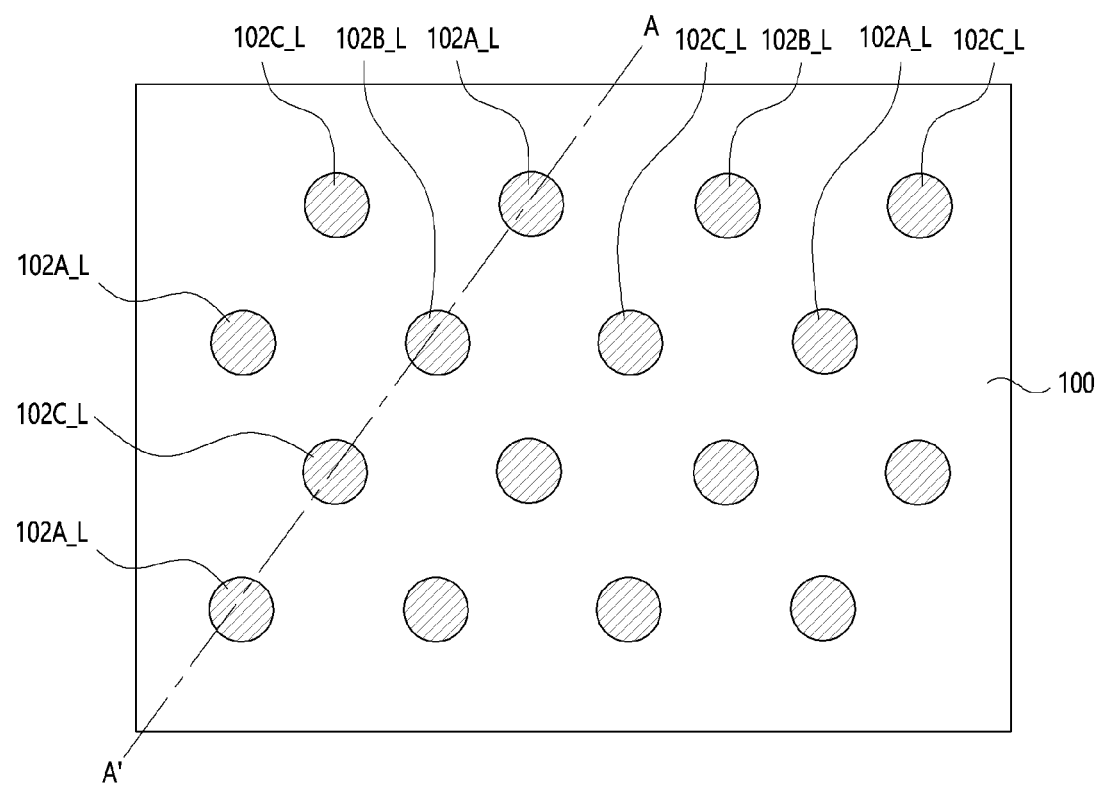
FIGS. 4A to 4L are plan views illustrating a method of forming capacitors in accordance with various embodiments.
Figure 5A:
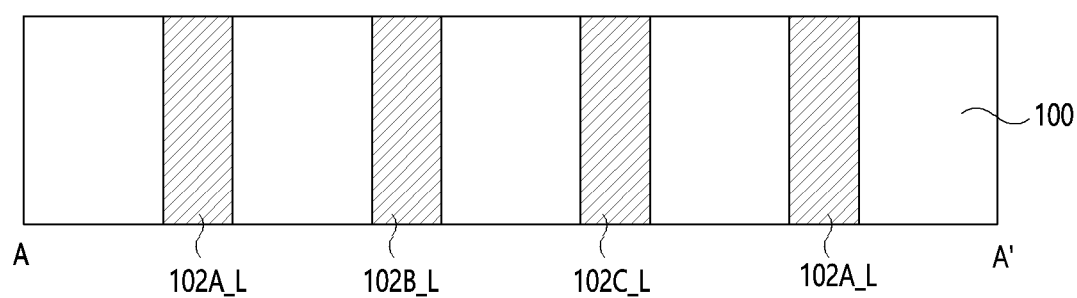
FIGS. 5A to 5L are cross-sectional views illustrating a method of forming capacitors in accordance with various embodiments.

Referring to FIGS. 4A and 5A, a plurality of first conductive patterns 102A_L, 102B_L and 102C_L may be formed. The first conductive patterns 102A_L, 102B_L and 102C_L may be formed by etching a first insulation layer 100 to form holes, and by filling the holes with a conductive material.

Although not depicted in the drawings, underlying structures may be formed under the first insulation layer 100. The first conductive patterns 102A_L, 102B_L and 102C_L may be electrically connected with the underlying structures.

Hereinafter, for convenience of explanation, the first conductive patterns 102A_L, 102B_L and 102C_L may be referred to as a 1-1 conductive pattern 102A_L, a 1-2 conductive pattern 102B_L and a 1-3 conductive pattern 102C_L.

Figure 4B:
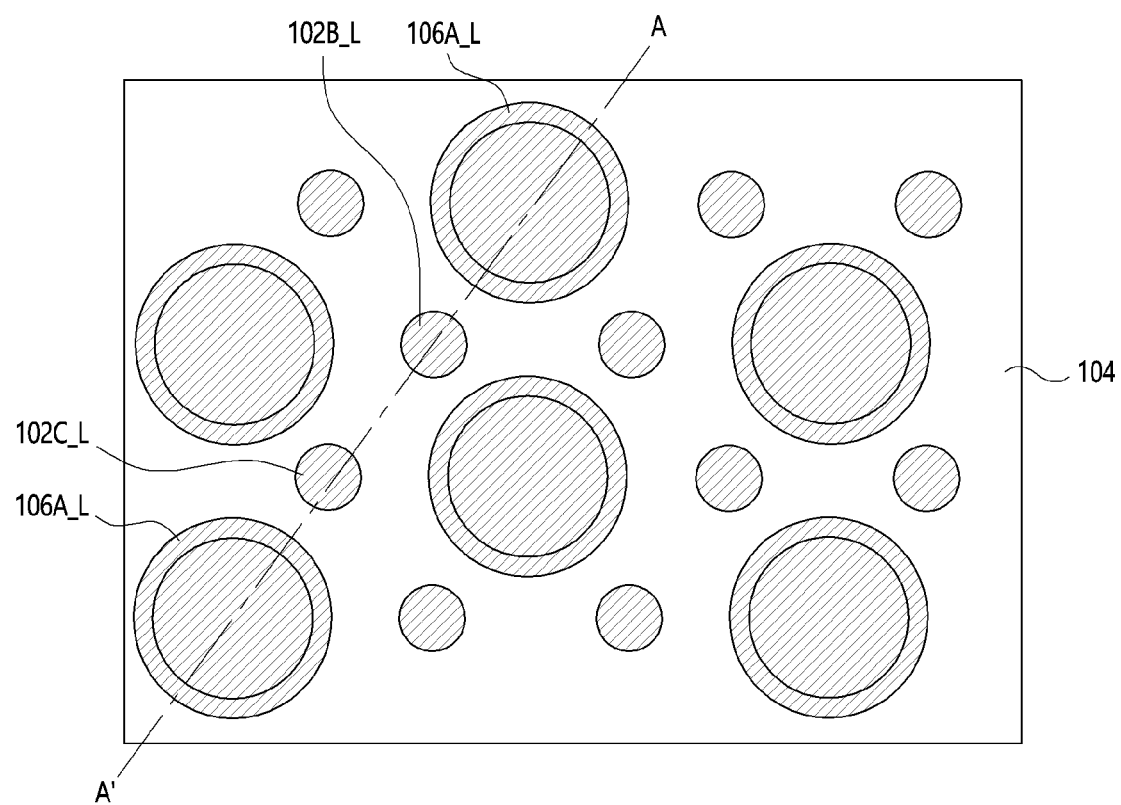
Figure 5B:
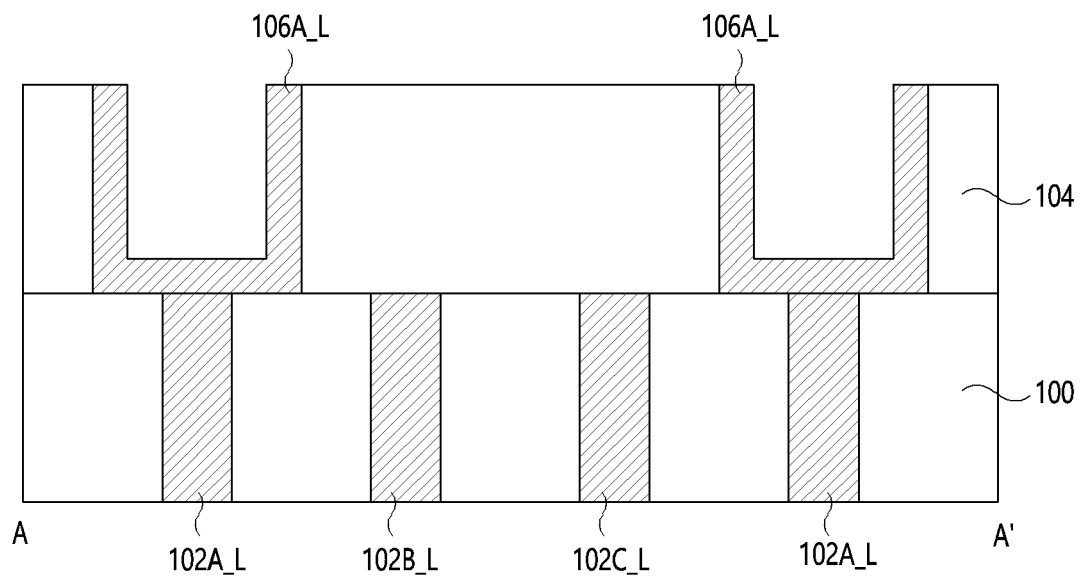

Referring to FIGS. 4B and 5B, a second conductive pattern 106A_L may be electrically connected to at least one of the first conductive patterns 102A_L, 102B_L and 102C_L.

Particularly, a second insulation layer 104 may be formed on the first insulation layer 100 with the first conductive patterns 102A_L, 102B_L and 102C_L. The second insulation layer 104 may be etched to form a hole configured to expose the 1-1 conductive pattern 102A_L. The hole may have a size greater than a width (or diameter) of the 1-1 conductive pattern 102A_L. The second conductive pattern 106A_L may be conformally formed on an inner wall of the hole. The second conductive pattern 106A_L may have a cylindrical shape including a closed lower surface and an opened upper surface.

Here, the 1-1 conductive pattern 102A_L and the second conductive pattern 106A_L may function as a first lower electrode LE1 of a first capacitor CAP1 formed by the following processes.

Figure 4C:
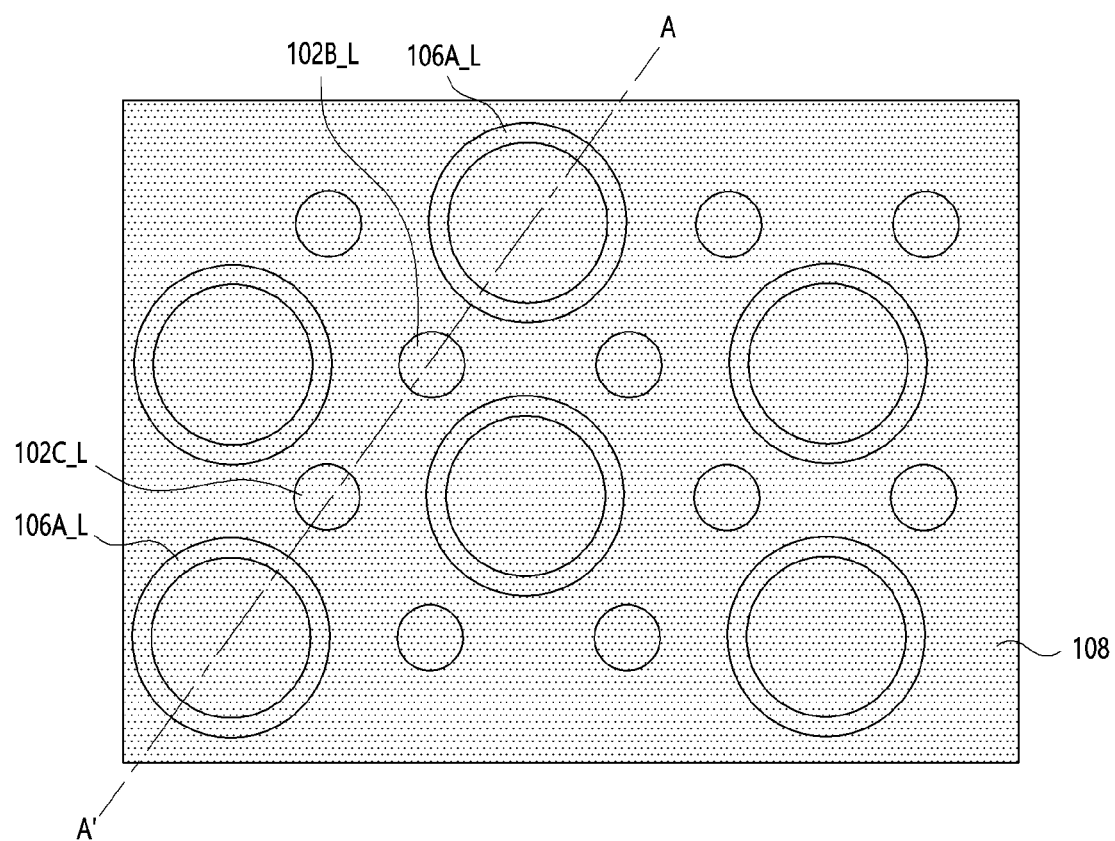
Figure 5C:
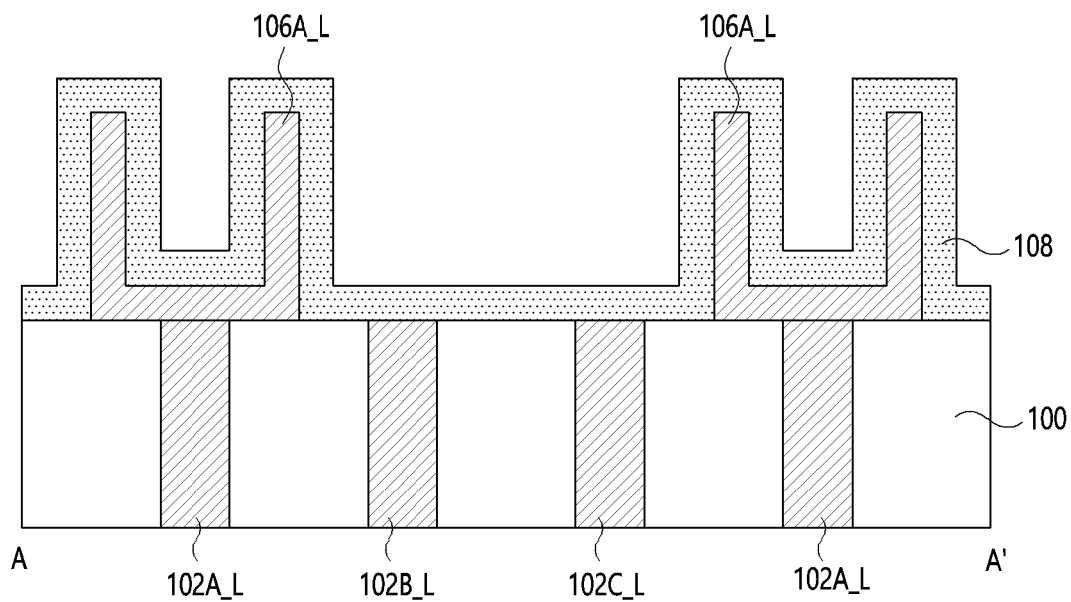

Referring to FIGS. 4C and 5C, the second insulation layer 104 may then be removed. A first dielectric layer 108 may be conformally formed on the second conductive pattern 106A_L, the first insulation layer 100, the 1-2 conductive pattern 102B_L and the 1-3 conductive pattern 102C_L. The first dielectric layer 108 may be formed on an inner wall and an outer wall of the second conductive pattern 106A_L, but may not fill an entire space of the second conductive pattern 106A_L.

Figure 4D:
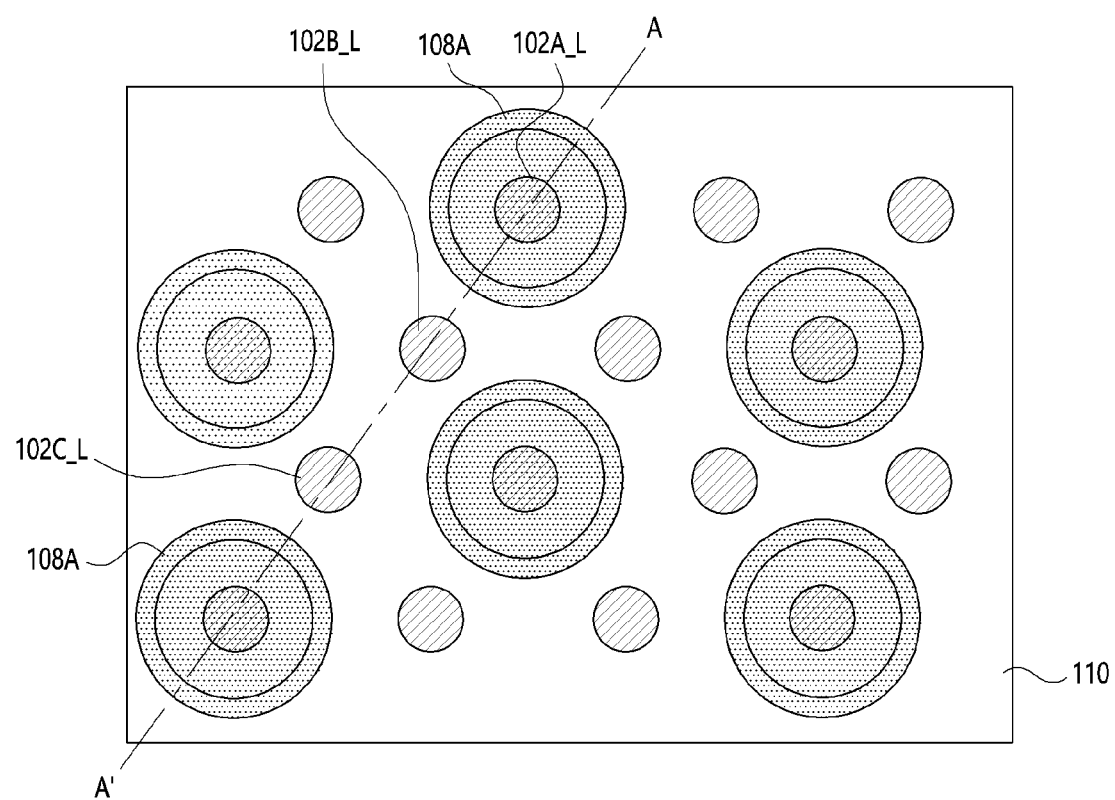
Figure 5D:
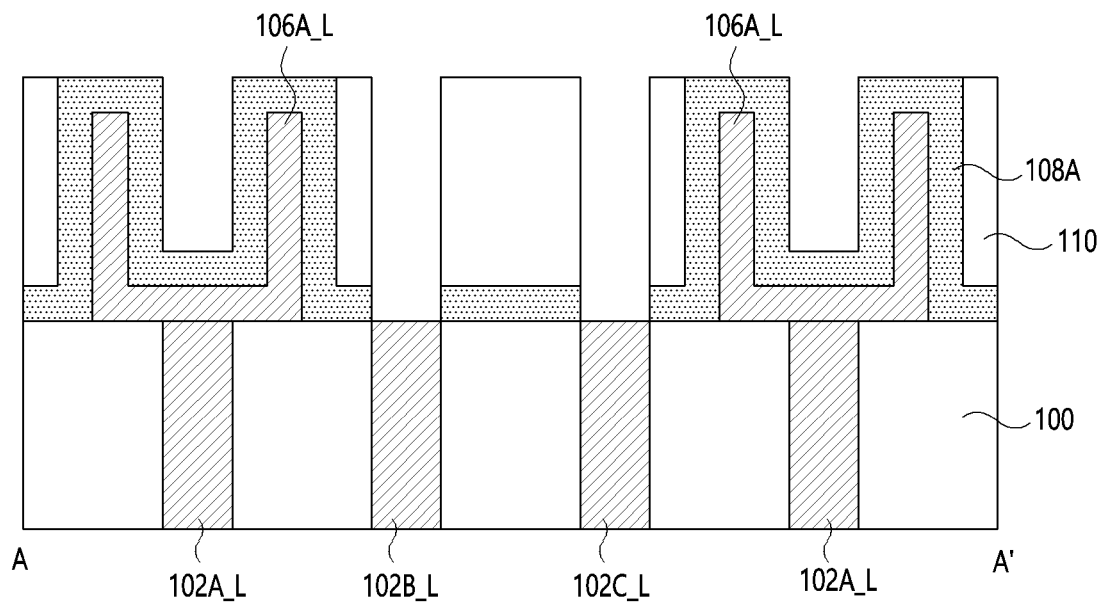

Referring to FIGS. 4D and 5D, a third insulation layer 110 may then be formed on the first dielectric layer 108. The third insulation layer 110 may be etched to form a plurality of holes. At least one of the holes may be configured to expose the first dielectric layer 108 in the second conductive pattern 106A_L. The remaining holes may be formed by etching the third insulation layer 110 and the first dielectric layer 108 to expose the 1-2 conductive pattern 102B_L and the 1-3 conductive pattern 102C_L. The first dielectric layer 108 may be partially etched to form a first dielectric pattern 108A. The first dielectric pattern 108A may function as a first dielectric layer CS1 of the first capacitor CAP1 in FIG. 2B.

Figure 4E:
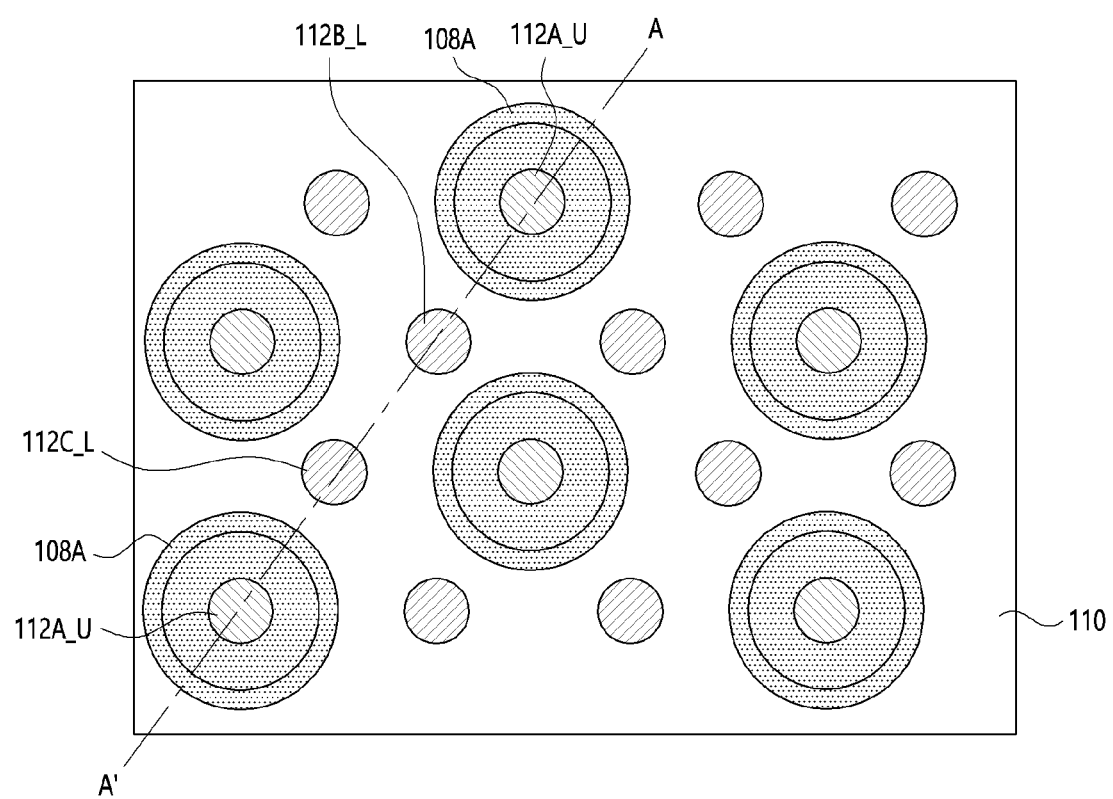
Figure 5E:
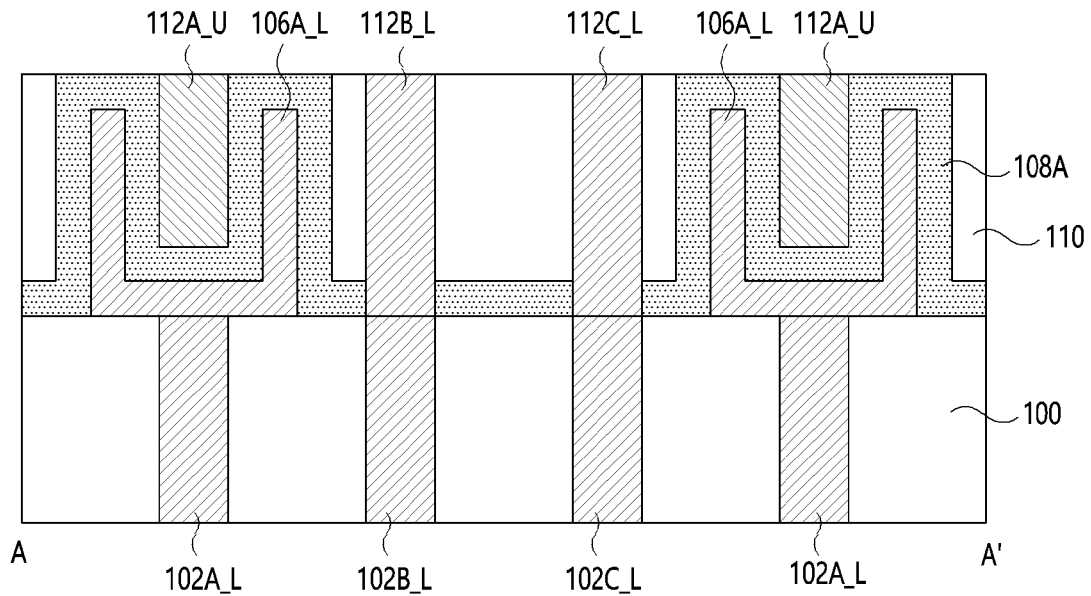

Referring to FIGS. 4E and 5E, the holes of the third insulation layer 110 may be filled with third conductive patterns 112A_U, 112B_L and 112C_L. Hereinafter, for convenience of explanation, the third conductive patterns 112A_U, 112B_L and 112C_L may be referred to as a 3-1 conductive pattern 112A_U, a 3-2 conductive pattern 112B_L and a 3-3 conductive pattern 112C_L.

The 3-1 conductive pattern 112A_U may be configured to contact the first dielectric pattern 108A. The 3-2 conductive pattern 112B_L may be configured to contact the 1-2 conductive pattern 102B_L. The 3-3 conductive pattern 112C_L may be configured to contact the 1-3 conductive pattern 102C_L.

Figure 4F:
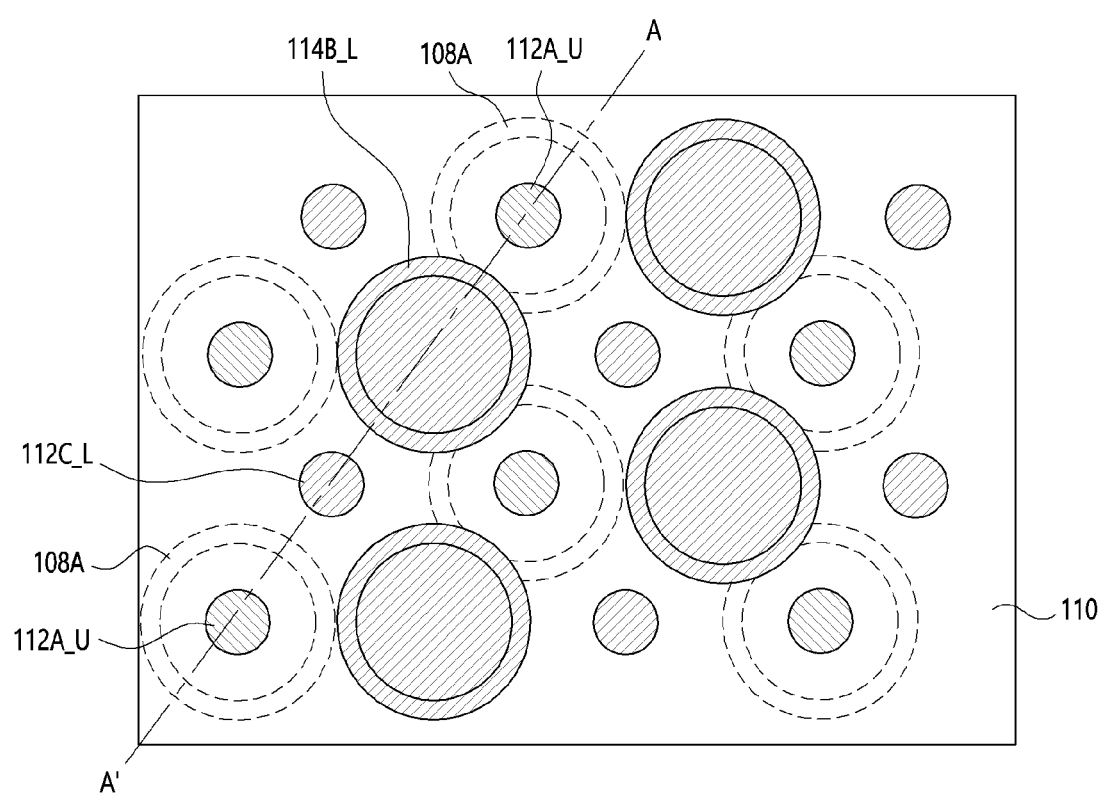
Figure 5F:
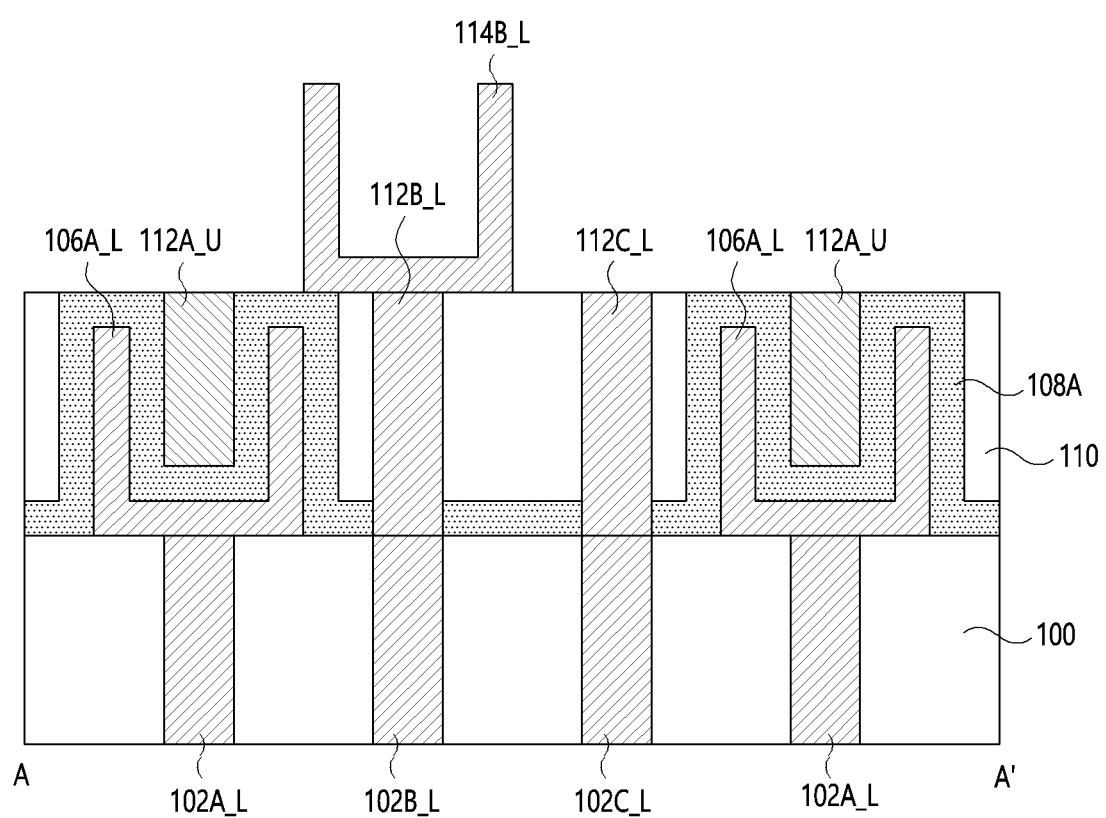

Referring to FIGS. 4F and 5F, a fourth conductive pattern 114B_L may be formed on the third insulation layer 110. The fourth conductive pattern 114B_L may electrically contact the 3-2 conductive pattern 112B_L. The fourth conductive pattern 114B_L may have a cylindrical shape including a closed lower surface and an opened upper surface. The fourth conductive pattern 114B_L may be formed by processes substantially the same as the processes for forming the second conductive pattern 106A_L in FIGS. 4B and 5B. Thus, any further illustrations with respect to the process for forming the fourth conductive pattern 114B_L may be omitted herein for brevity.

Here, the 1-2 conductive pattern 102B_L, the 3-2 conductive pattern 112B_L and the fourth conductive pattern 114B_L may function as a second lower electrode LE2 of a second capacitor CAP2.

Figure 4G:
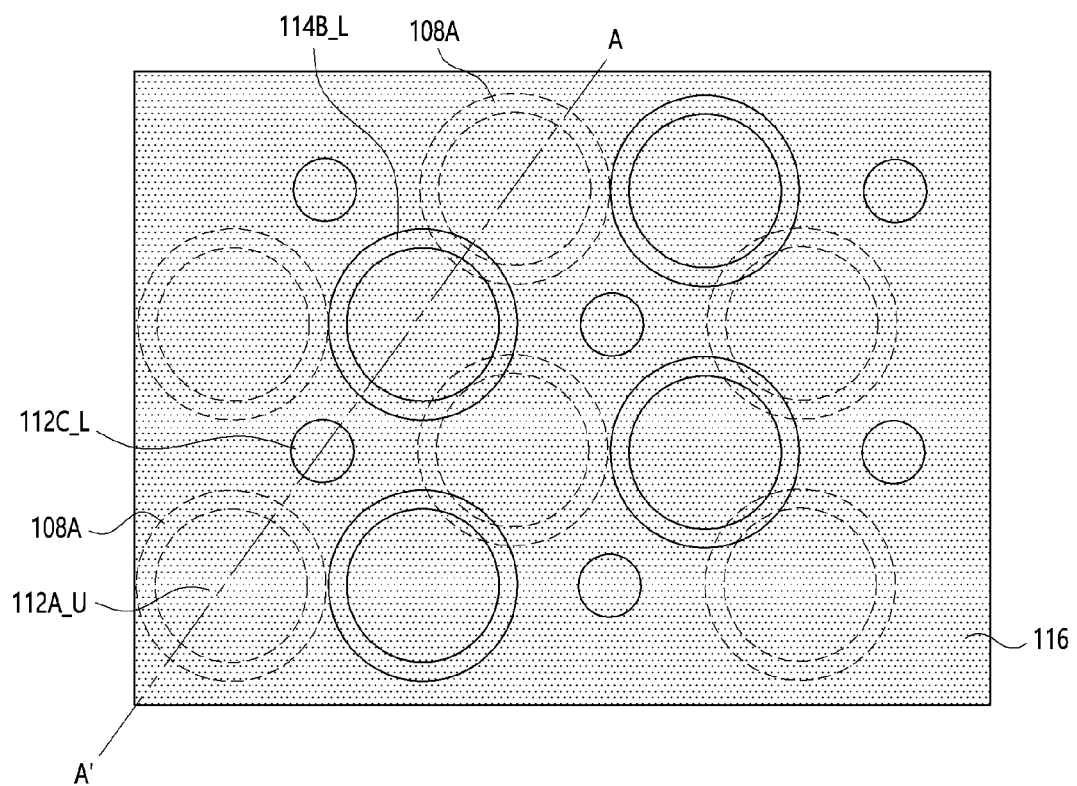
Figure 5G:
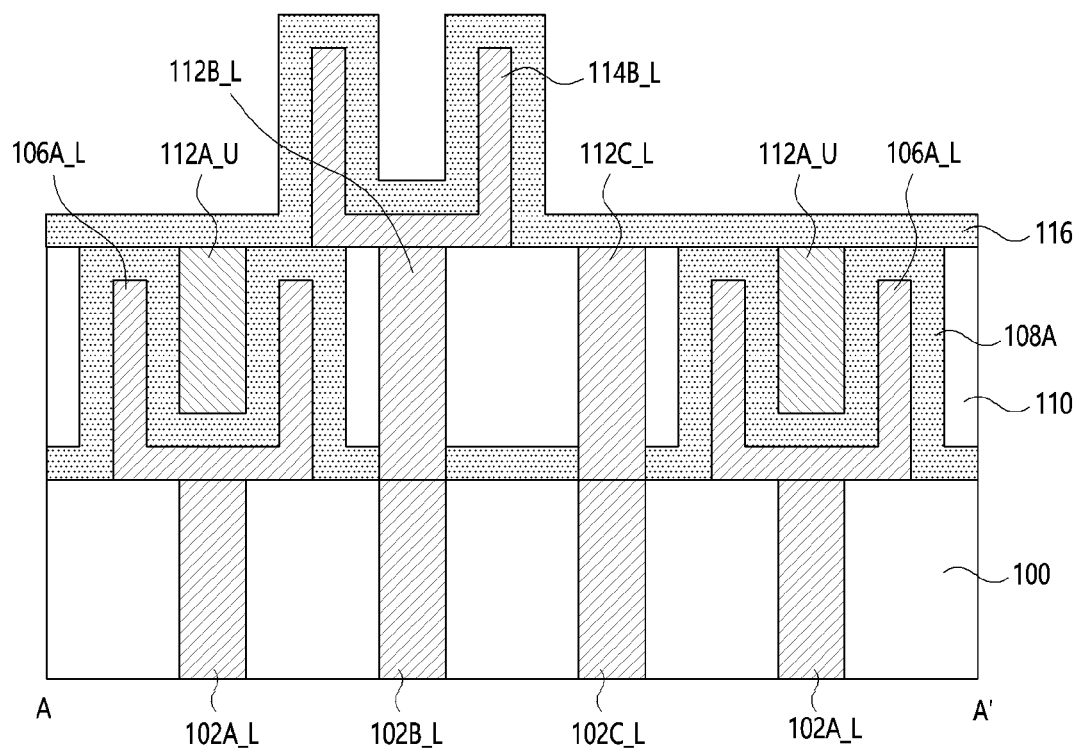

Referring to FIGS. 4G and 5G, a second dielectric layer 116 may be conformally formed on the fourth conductive pattern 114B_L. The second dielectric layer 116 may be formed on an inner wall and an outer wall of the fourth conductive pattern 114B_L, but may not fill an entire space of the fourth conductive pattern 114B_L.

Figure 4H:
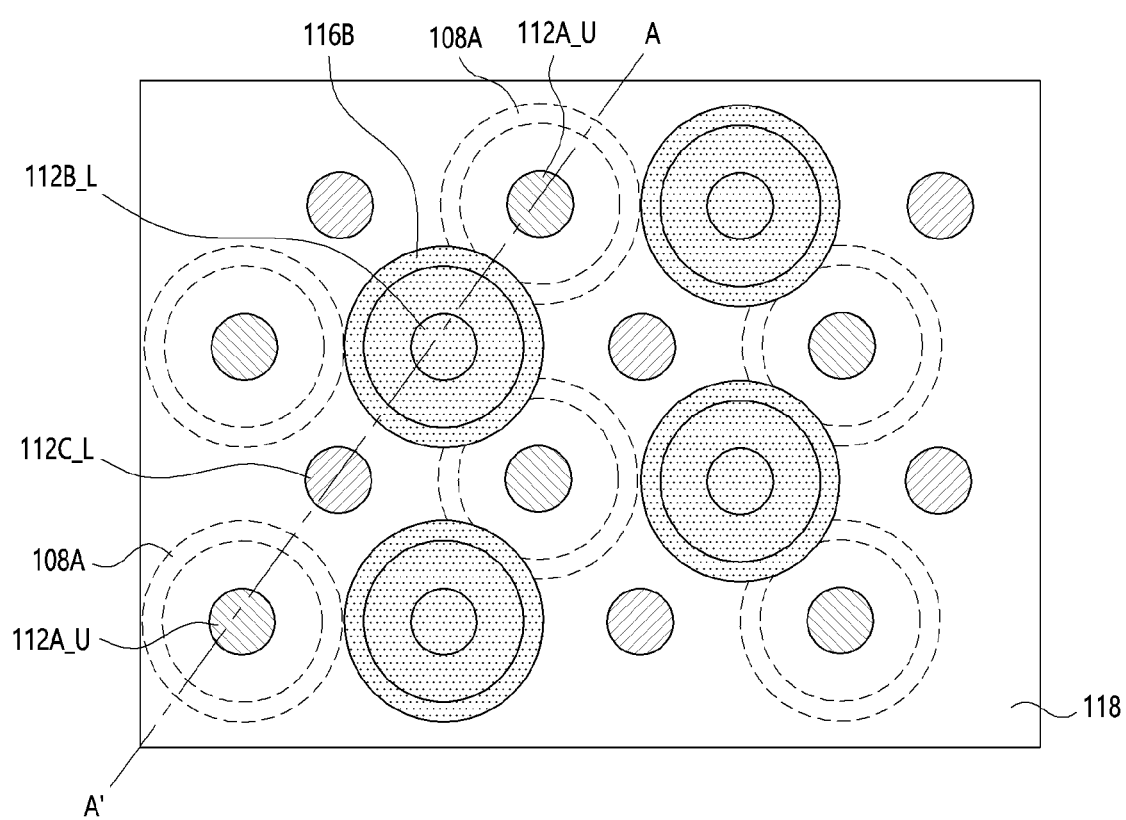
Figure 5H:
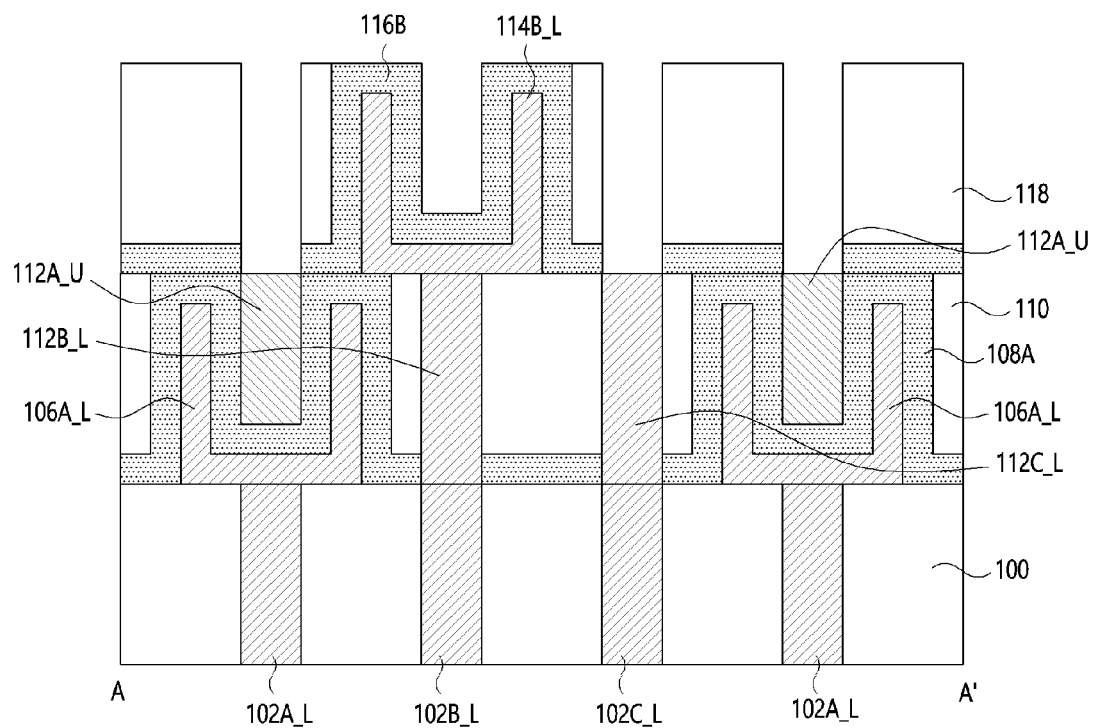

Referring to FIGS. 4H and 5H, a fourth insulation layer 118 may then be formed on the second dielectric layer 116. The fourth insulation layer 118 may be etched to form a plurality of holes. At least one of the holes may be configured to expose the second dielectric layer 116 in the fourth conductive pattern 114B_L. The remaining holes may be formed by etching the fourth insulation layer 118 and the second dielectric layer 116 to expose upper surfaces of the 3-1 conductive pattern 112A_U and the 3-3 conductive pattern 112C_L. The second dielectric layer 116 may be partially etched to form a second dielectric pattern 116B. The second dielectric pattern 116B may function as a second dielectric layer CS2 of the second capacitor CAP2 in FIG. 2B.

Figure 4I:
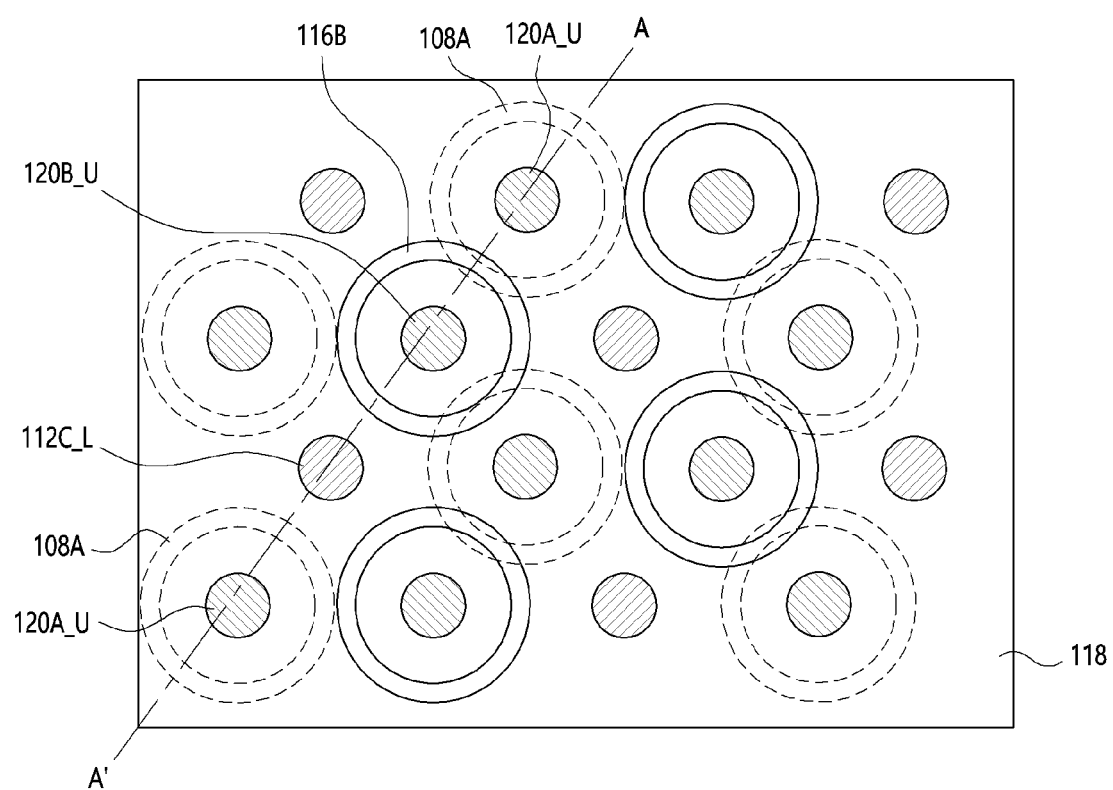
Figure 5I:
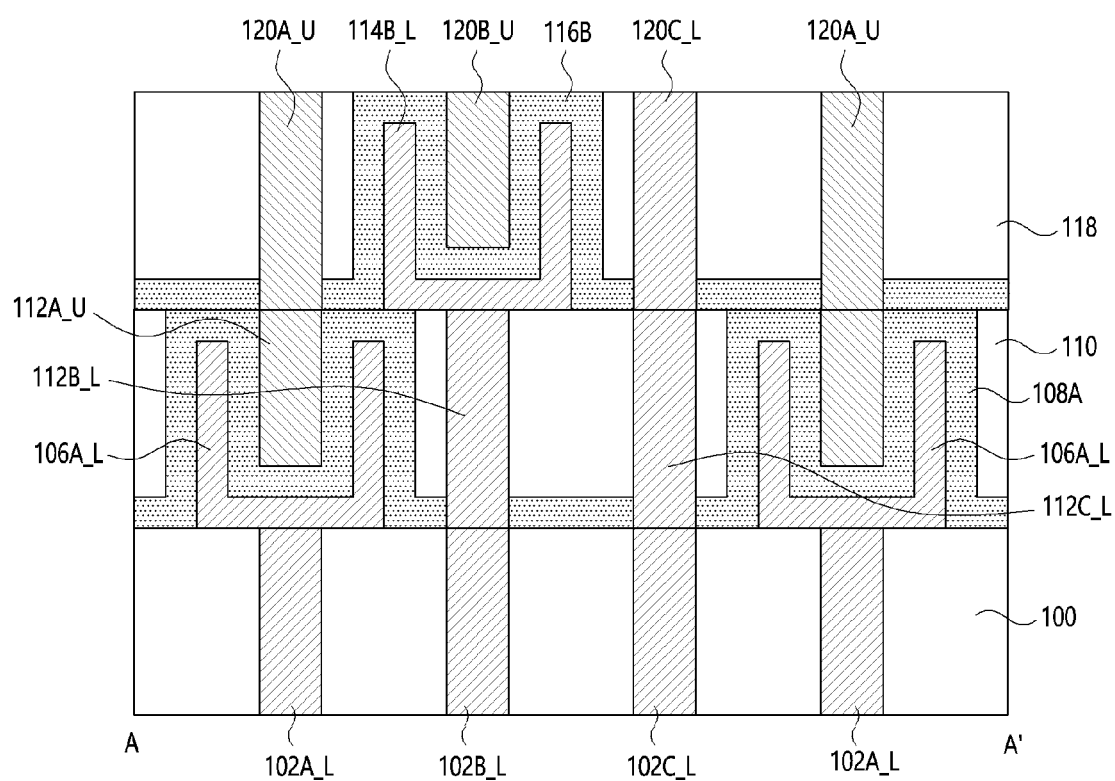

Referring to FIGS. 4I and 5I, the holes of the fourth insulation layer 118 may be filled with fifth conductive patterns 120A_U, 120B_U and 120C_L. Hereinafter, for convenience of explanation, the fifth conductive patterns 120A_U, 120B_U and 120C_L may be referred to as a 5-1 conductive pattern 120A_U, a 5-2 conductive pattern 120B_U and a 5-3 conductive pattern 120C_L.

The 5-2 conductive pattern 120B_U may be configured to contact the second dielectric layer 116B (or CS2). The 5-1 conductive pattern 120A_U may be configured to contact the 3-1 conductive pattern 112A_U. The 5-3 conductive pattern 120C_L may be configured to contact the 3-3 conductive pattern 112C_L.

Figure 4J:
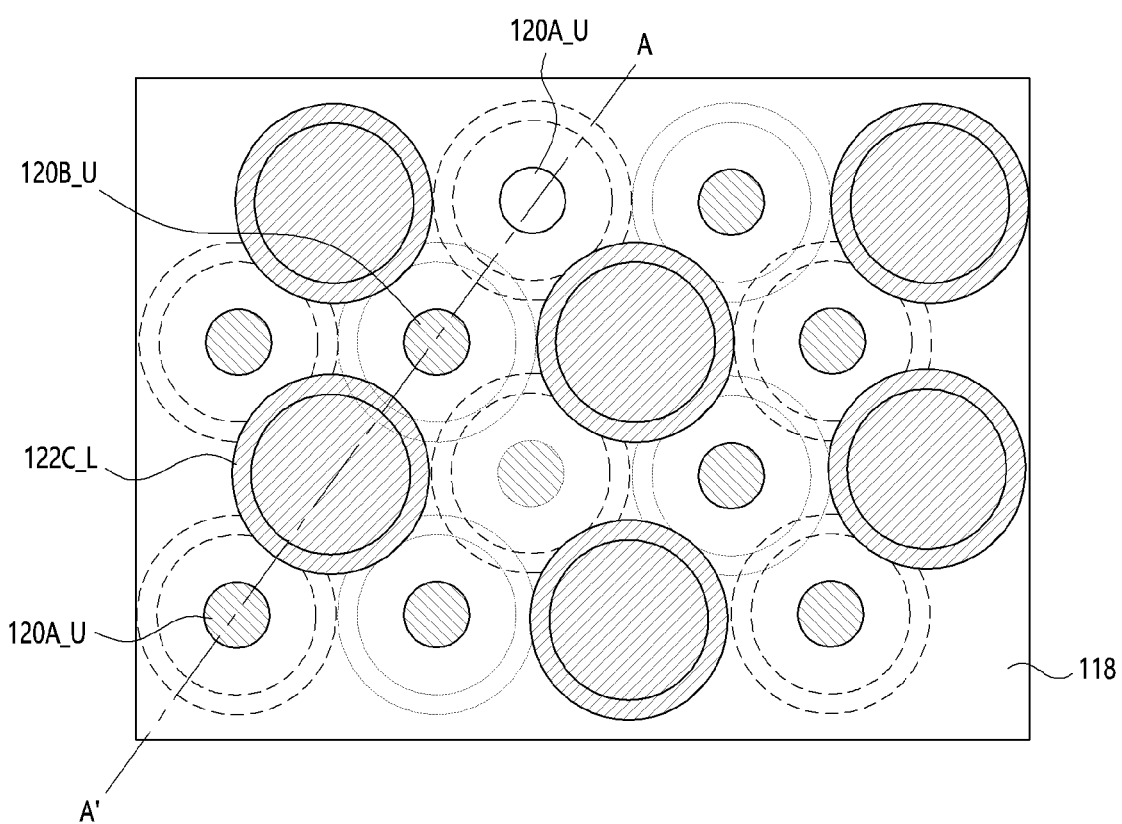
Figure 5J:
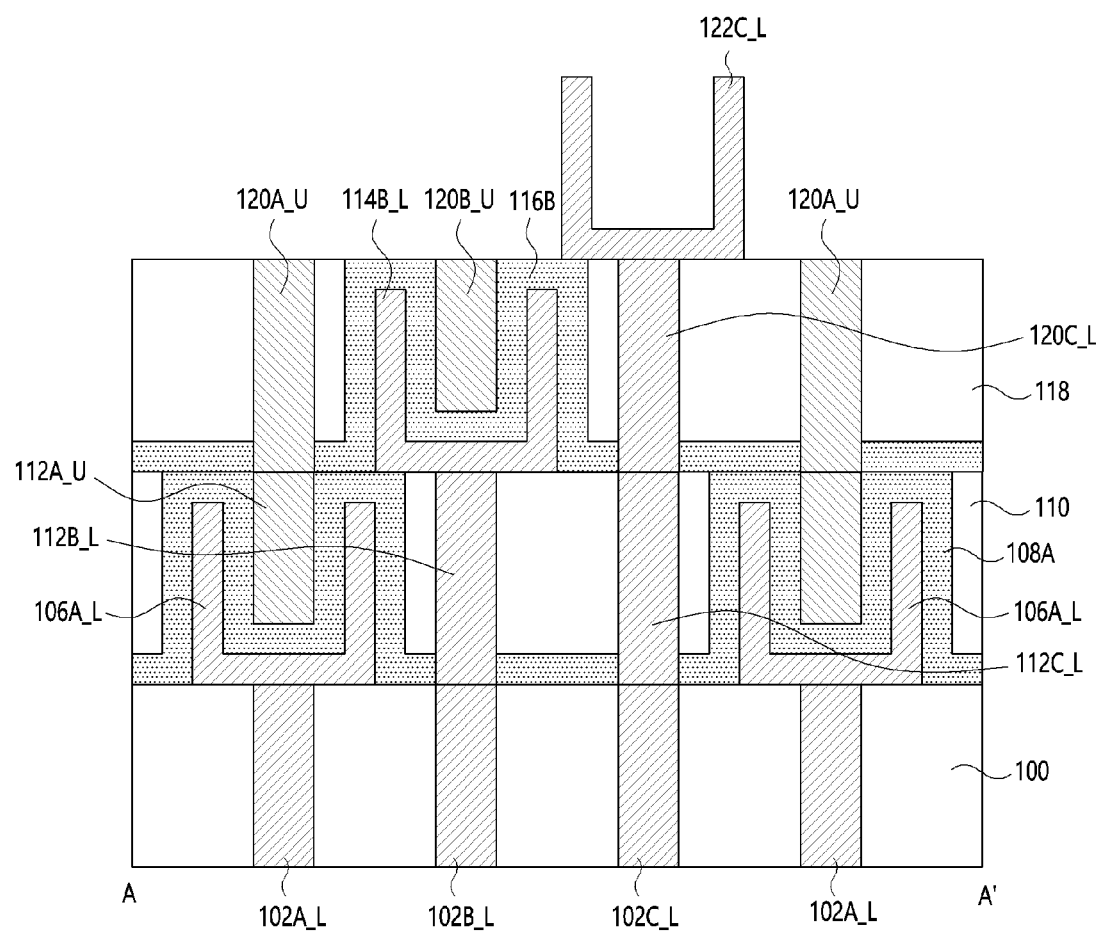

Referring to FIGS. 4J and 5J, a sixth conductive pattern 122C_L may be formed on the fourth insulation layer 118. The sixth conductive pattern 122C_L may electrically contact the 5-3 conductive pattern 120C_L. The sixth conductive pattern 122C_L may have a cylindrical shape including a closed lower surface and an opened upper surface. The sixth conductive pattern 122C_L may be formed by processes substantially the same as the processes for forming the second conductive pattern 106A_L in FIGS. 4B and 5B. Thus, any further illustrations with respect to the process for forming the sixth conductive pattern 122C_L may be omitted herein for brevity.

Here, the 1-3 conductive pattern 102C_L, the 3-3 conductive pattern 112C_L, the 5-3 conductive pattern 120C_L and the sixth conductive pattern 122C_L may function as a third lower electrode LE3 of a third capacitor CAP3.

Figure 4K:
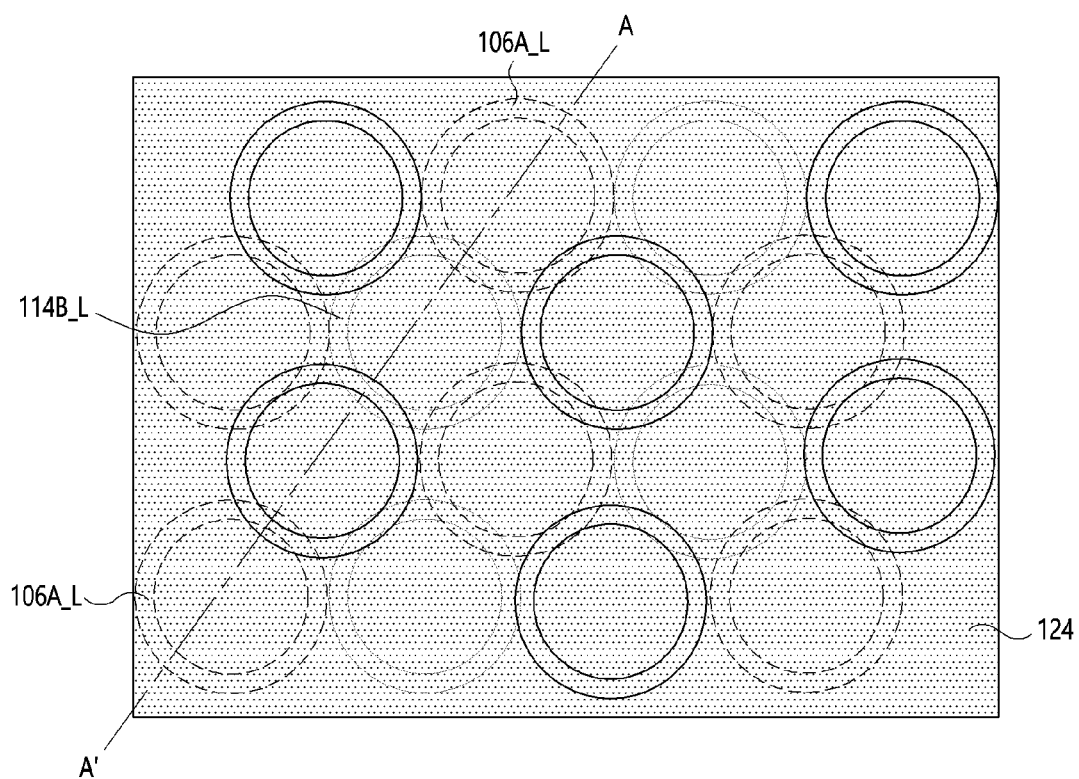
Figure 5K:
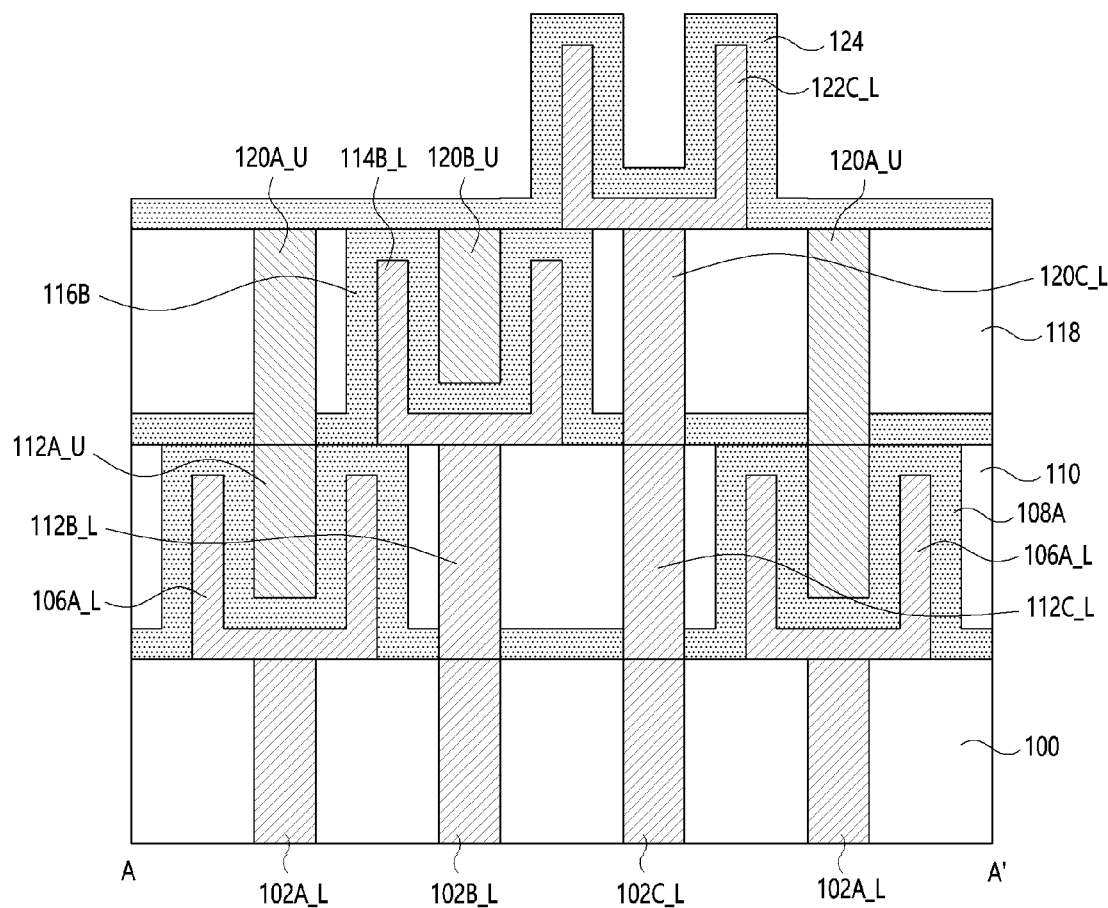

Referring to FIGS. 4K and 5K, a third dielectric layer 124 may be conformally formed on the sixth conductive pattern 122C_L. The third dielectric layer 124 may be formed on an inner wall and an outer wall of the sixth conductive pattern 122C_L, but may not fill an entire space of the sixth conductive pattern 122C_L.

Figure 4L:
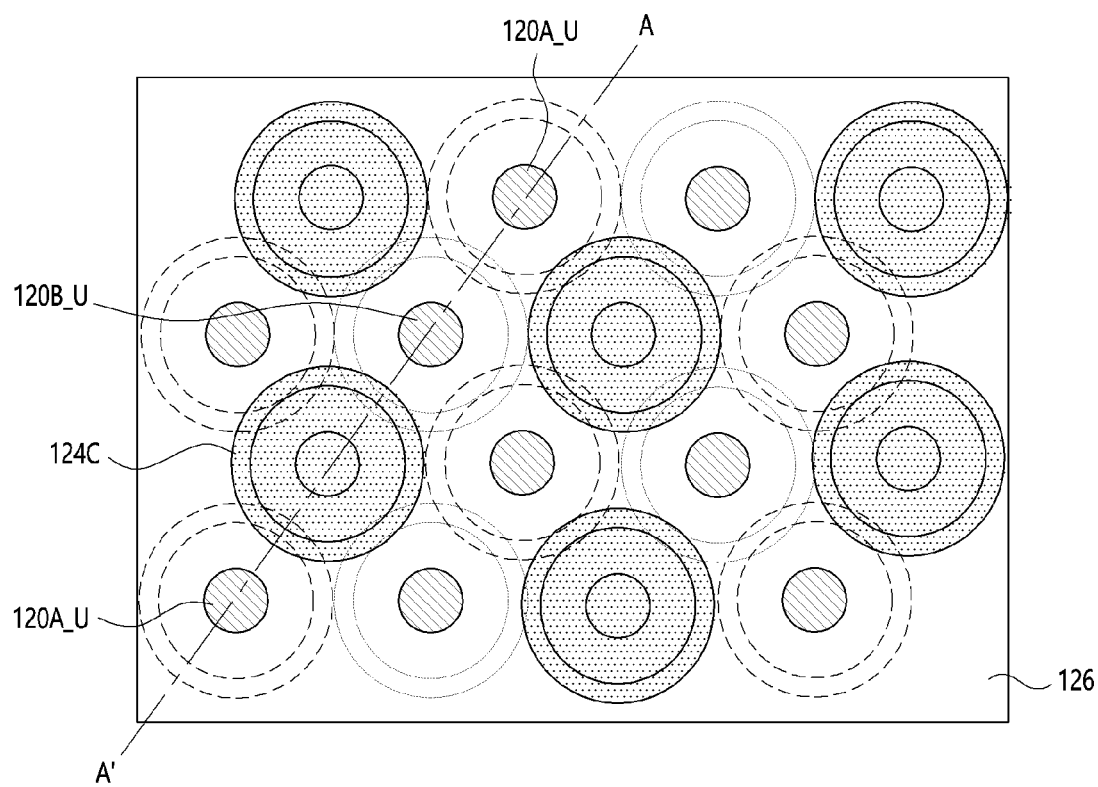
Figure 5L:
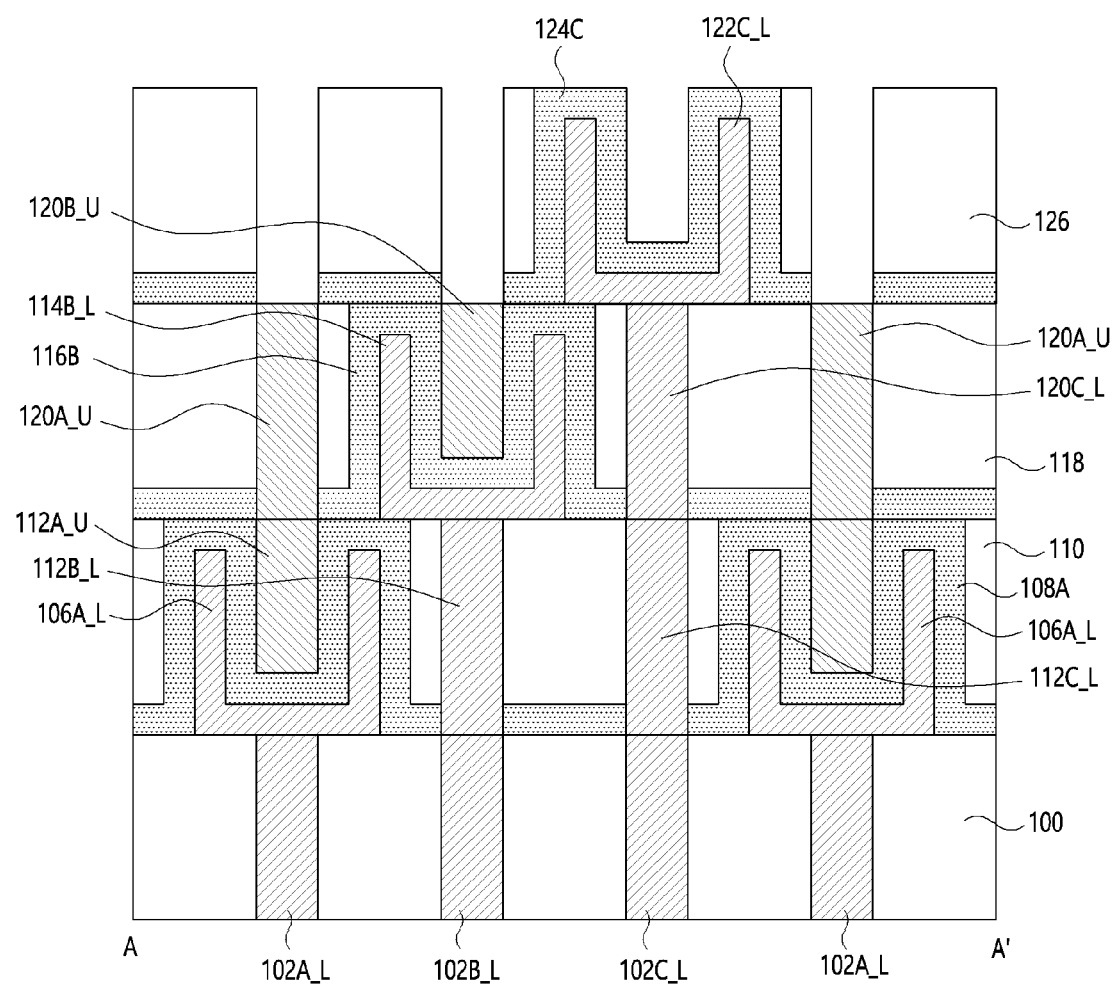

Referring to FIGS. 4L and 5L, a fifth insulation layer 126 may then be formed on the third dielectric layer 124. The fifth insulation layer 126 may be etched to form a plurality of holes. At least one of the holes may be configured to expose the third dielectric layer 124 in the sixth conductive pattern 122C_L. The remaining holes may be formed by etching the fifth insulation layer 126 and the third dielectric layer 124 to expose upper surfaces of the 5-1 conductive pattern 120A_U and the 5-2 conductive pattern 120B_U. The third dielectric layer 124 may be partially etched to form a third dielectric pattern 124C. The third dielectric pattern 124C may function as a third dielectric layer CS3 of the third capacitor CAP3 in FIG. 2B.

Referring to FIGS. 2A and 2B, the holes of the fifth insulation layer 126 may be filled with seventh conductive patterns 128A_U, 128B_U and UE3. Hereinafter, for convenience of explanation, the seventh conductive patterns 128A_U, 128B_U and UE3 may be referred to as a 7-1 conductive pattern 128A_U, a 7-2 conductive pattern 128B_U and a 7-3 conductive pattern UE3.

The 7-3 conductive pattern UE3 may be configured to contact the third dielectric pattern 124C. The 7-1 conductive pattern 128A_U may be configured to contact the 5-1 conductive pattern 120A_U. The 7-2 conductive pattern 128B_U may be configured to contact the 5-2 conductive pattern 120B_U.

Therefore, the first capacitor CAP1, the second capacitor CAP2 and the third capacitor CAP3 may be completed. The first capacitor CAP1 may include the first lower electrode LE1, the first dielectric pattern 108A and the first upper electrode UE1. The first lower electrode LE1 may include the 1-1 conductive pattern 102A_L and the second conductive pattern 106A_L. The first upper electrode UE1 may include the 3-1 conductive pattern 112A_U, the 5-1 conductive pattern 120A_U and the 7-1 conductive pattern 128A_U. The second capacitor CAP2 may include the second lower electrode LE2, the second dielectric pattern 116B and the second upper electrode UE2. The second lower electrode LE2 may include the 1-2 conductive pattern 102B_L, the 3-2 conductive pattern 112B_L and the fourth conductive pattern 114B_L. The second upper electrode UE2 may include the 5-2 conductive pattern 120B_U and the 7-2 conductive pattern 128B_U. The third capacitor CAP3 may include the third lower electrode LE3, the third dielectric pattern 124C and the third upper electrode UE3. The third lower electrode LE3 may include the 1-3 conductive pattern 102C_L, the 3-3 conductive pattern 112C_L, the 5-3 conductive pattern 120C_L and the sixth conductive pattern 122C_L. The third upper electrode UE3 may include the 7-3 conductive pattern UE3.

Figure 6:
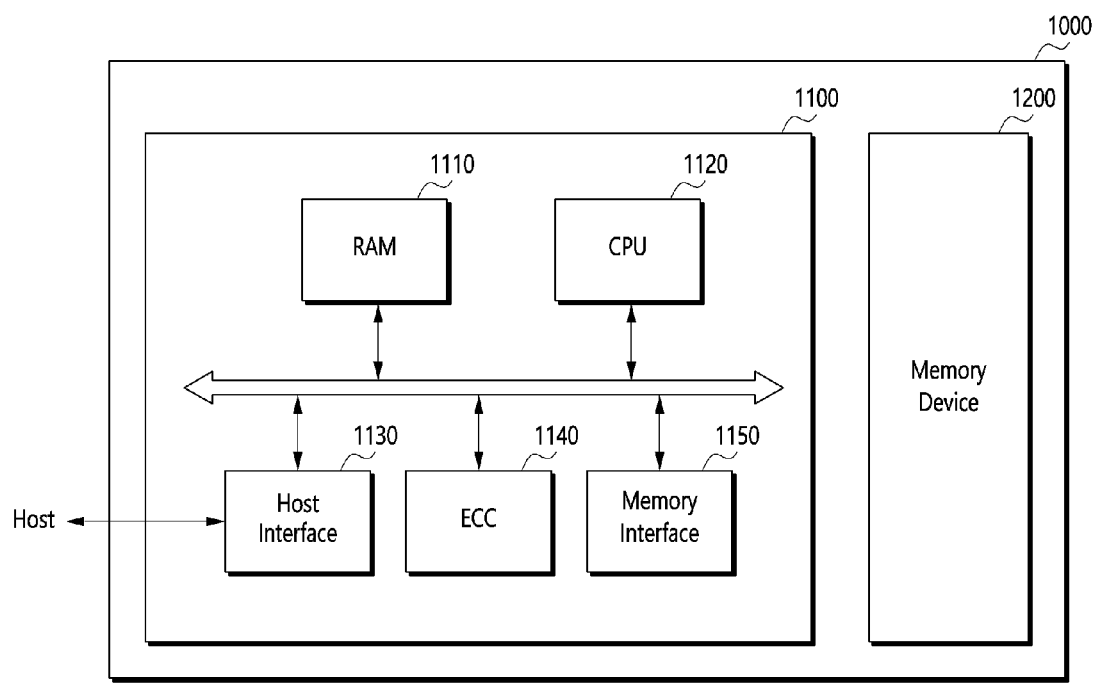
FIG. 6 is a block diagram illustrating a memory system in accordance with various embodiments.

FIG. 6 is a block diagram illustrating a memory system in accordance with various embodiments.

Referring to FIG. 6, a memory system 1000 may include a memory device 1200 and a controller 1100.

The memory device 1200 may be used for storing data information such as texts, graphics, software codes, etc. The memory device 1200 may include a non-volatile memory. Further, the memory device 1200 may include the capacitors of FIGS. 1 to 5L where the positions of the dielectric layers may be different from each other to improve an integration degree of the capacitors.

The memory device 1200 may include memory blocks divided by slits having an insulation bridge.

The controller 1100 may be connected with a host and the memory device 1200. The controller 1100 may access the memory device 1200 in response to requests of the host. For example, the controller 1100 may control a read operation, a write operation, an erase operation, a background operation, etc., of the memory device 1200.

The controller 1100 may include a random-access memory (RAM) 1110, a central processing unit (CPU) 1120, a host interface 1130, an error correction code (ECC) circuit 1140 and a memory interface 1150.

The RAM 1110 may be used as an operation memory of the CPU 1120, a cache memory of the memory device 1200, a buffer memory between the memory device 1200 and the host, etc. The RAM 1110 may be replaced by a static random-access memory (SRAM), a read only memory (ROM), etc.

The CPU 1120 may control operations of the controller 1100. For example, the CPU 1120 may use firmware such as a flash translation layer (FTL) stored in the RAM 1110.

The host interface 1130 may be interfaced with the host. For example, the host interface 1130 may be interfaced with the host through at least one of various protocols such as a universal serial bus (USB) protocol, a multi media card (MMC) protocol, a peripheral component interconnection (PCI) protocol, a PCI-express protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The ECC circuit 1140 may detect and correct an error in data read from the memory device 1200 using an error correction code (ECC).

The memory interface 1150 may be interfaced with the memory device 1200. For example, the memory interface 1150 may include a NAND interface, a NOR interface, etc.

The controller 1100 may further include a buffer memory configured to temporarily store data. The buffer memory may temporarily store the data transmitted to an external device through the host interface 1130. The buffer memory may temporarily store the data transmitted to the memory device 1200 through the memory interface 1150. The controller 1100 may further include a ROM configured to store code data for interfacing the controller 1100 with the host.

Therefore, the insulation bridge may cure the structural defect of the memory blocks to improve characteristics of the memory system 1000.

Figure 7:
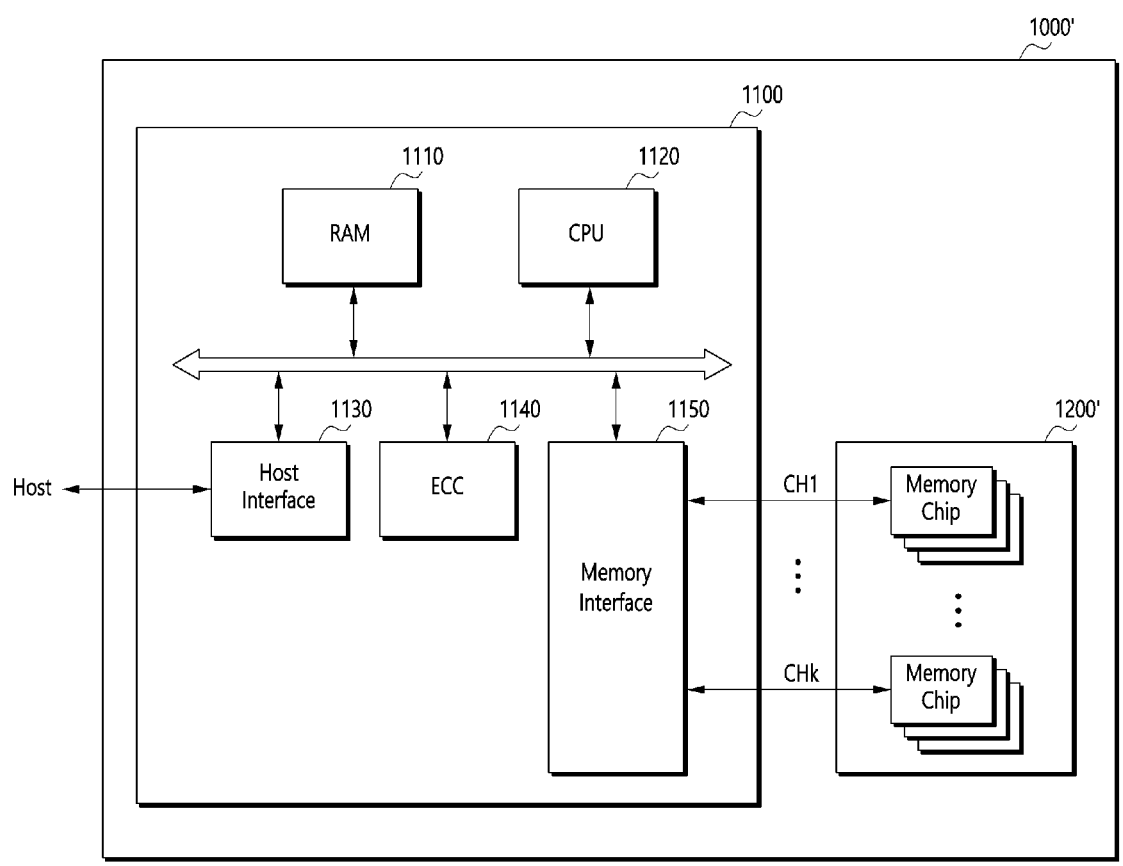
FIG. 7 is a block diagram illustrating a memory system in accordance with various embodiments.

FIG. 7 is a block diagram illustrating a memory system in accordance with various embodiments.

Referring to FIG. 7, a memory system 1000' may include a memory device 1200' and a controller 1100'. The controller 1100' may include a RAM 1110, a CPU 1120, a host interface 1130, an ECC circuit 1140 and a memory interface 1150.

The memory device 1200' may include a non-volatile memory. Further, the memory device 1200' may include the capacitors of FIGS. 1 to 5L where the positions of the dielectric layers may be different from each other to improve an integration degree of the capacitors.

Further, the memory device 1200' may include a multi-chip package including a plurality of memory chips. The memory chips may be divided into a plurality of groups. The groups may be communicated with the controller 1100' through first to kth channels CH1~CHk. The memory chip in one group may be communicated with the controller 1100' through a common channel. The memory system 1000' may include channels respectively connected to corresponding memory chips in the memory device 1200'.

Therefore, the positions of the dielectric layers in each of the capacitors of the memory system 1000' may be different from each other to improve an integration degree of the capacitors.

Figure 8:
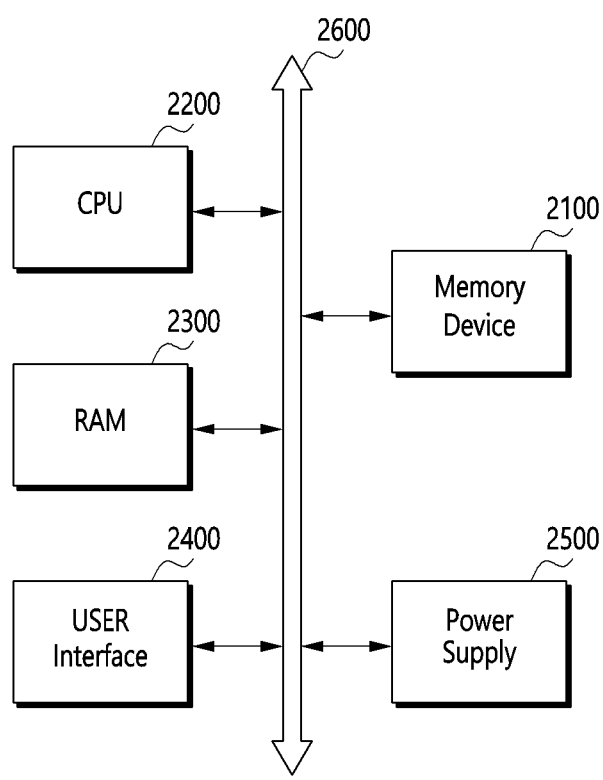
FIG. 8 is a block diagram illustrating a computing system in accordance with various embodiments.

FIG. 8 is a block diagram illustrating a computing system in accordance with various embodiments.

Referring to FIG. 8, a computing system 2000 may include a memory device 2100, a CPU 2200, a RAM 2300, a user interface 2400, a power supply 2500 and a system bus 2600.

The memory device 2100 may store data provided through the user interface 2400, data processed by the CPU 2200, etc. Further, the memory device 2100 may be electrically coupled to the CPU 2200, the RAM 2300, the user interface 2400 and the power supply 2500 through the system bus 2600. For example, the memory device 2100 may be directly connected to the system bus 2600, or indirectly connected to the system bus 2600 through a controller. When the memory device 2100 may be directly connected to the system bus 2600, functions of the controller may be performed by the CPU 2200, the RAM 2300, etc.

The memory device 2100 may include a non-volatile memory. Further, the memory device 2100 may include the capacitors of FIGS. 1 to 5L where the positions of the dielectric layers may be different from each other to improve an integration degree of the capacitors. The memory device 2100 may include a multi-chip package including a plurality of memory devices of embodiments.

In various embodiments, the computing system 2000 may include a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigator, a black box, a digital camera, a 3-dimensional television, a digital audio recorder, a digital audio player, a digital picture recorder, a digital picture player, a digital video recorder, a digital video player, a telematics network, an RFID, etc.

Therefore, an integration degree of the capacitors may be improved to increase characteristics of the computing system 2000.

Figure 9:
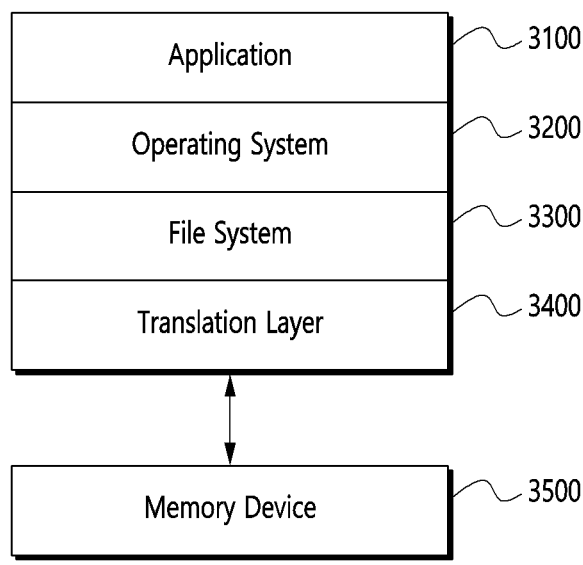
FIG. 9 is a block diagram illustrating a computing system in accordance with various embodiments.

FIG. 9 is a block diagram illustrating a computing system in accordance with various embodiments.

Referring to FIG. 9, a computing system 3000 may include a software layer including an operating system (OS) 3200, an application 3100, a file system 3300, a translation layer 3400, etc. The computing system 3000 may include a hardware layer such as a memory device 3500.

The OS 3200 may manage the software and the hardware of the computing system 3000. The OS 3200 may control program operations of a CPU. The application 3100 may include various application programs run in the computing system 3000. The application 3100 may include a utility run by the OS 3200.

The file system 3300 may be a logical structure for managing data, files, etc., in the computing system 3000.

The file system 3300 may organize the file or the data to be stored in the memory device 3500. The file system 3300 may be determined in accordance with the OS 3200 used in the computing system 3000. For example, when the OS 3200 may be the window of the Microsoft company, the file system 3300 may include a file allocation table (FAT), an NT file system (NTFS), etc. When the OS 3200 may be in Unix/Linux, the file system 3300 may include an extended file system (EXT), a Unix file system (UFS), a journaling file system (JFS), etc.

In various embodiments, the OS 3200, the application 3100 and the file system 3300 may be represented by separate blocks in drawings. Alternatively, the OS 3200 may include the application 3100 and the file system 3300.

The translation layer 3400 may translate address into a proper shape of the memory device 3500 in response to a request of the file system 3300. For example, the translation layer 3400 may translate a logic address generated by the file system 3300 into a physical address of the memory device 3500. Mapping information of the logic address and the physical address may be stored as an address translation table. For example, the translation layer 3400 may include a flash translation layer (FTL), a universal flash storage link layer (ULL), etc.

The memory device 3500 may include a non-volatile memory device including any of the capacitors of FIGS. 1 to 5L. The computing system 3000 may be classified into an OS layer performed in an upper-level region and a controller layer performed in a lower-level region. The application 3100, the OS 3200 and the file system 3300 may be included in the OS layer to be driven by an operation memory of the computing system 3000. The translation layer 3400 may be included in the OS layer or the controller layer.

Therefore, the computing system 3000 of may include an improved integration degree of the capacitors used therein.

The above-described embodiments are intended to illustrate and not to limit the present invention. Various alternatives and equivalents are possible. The invention is not limited by the embodiments described herein. Nor is the invention limited to any specific type of a semiconductor device. Other additions, subtractions, or modifications are obvious in view of the present disclosure and are intended to fall within the scope of the appended claims.

What is claimed is:

1. A semiconductor device comprising:
   a first capacitor including a first lower electrode, a first upper electrode, and a first dielectric layer disposed between the first lower electrode and the first upper electrode at a first height; and
   a second capacitor spaced apart from the first capacitor, the second capacitor including a second lower electrode, a second upper electrode, and a second dielectric layer disposed between the second lower electrode and the second upper electrode at a second height different from the first height,
   wherein each of the first lower electrode and the second lower electrode comprises a first portion,
   wherein the first portion of the first lower electrode and the first portion of the second lower electrode have the same cylindrical shape,
   wherein the first portion of the first lower electrode is located at a different height than the first portion of the second lower electrode,
   wherein the first lower electrode further includes a second portion downwardly extended from the first portion of the first lower electrode, and
   wherein the first portion of the first lower electrode includes a closed lower surface and an opened upper surface and the first dielectric layer is disposed on the first portion of the first lower electrode.

2. The semiconductor device of claim 1, wherein the first lower electrode and the second lower electrode are partially overlapped with each other in a planar view.

3. The semiconductor device of claim 1, wherein the second lower electrode further includes:
   a second portion downwardly extended from the first portion of the second lower electrode,
   wherein the first portion of the second lower electrode includes a closed lower surface and an opened upper surface and the second dielectric layer is disposed on the first portion of the second lower electrode, and
   wherein the second portion of the second lower electrode has a height higher than a height of the second portion of the first lower electrode.

4. The semiconductor device of claim 3, wherein the first portion of the first lower electrode and the first portion of the second lower electrode are overlapped with each other in a planar view.

5. The semiconductor device of claim 1, further comprising a third capacitor spaced apart from the first capacitor and the second capacitor, the third capacitor including a third lower electrode, a third upper electrode and a third dielectric layer disposed between the third lower electrode and the third upper electrode at a third height different from the first and second heights.

6. The semiconductor device of claim 5, wherein the first lower electrode, the second lower electrode and the third lower electrode are partially overlapped with each other in a planar view.

7. The semiconductor device of claim 6, wherein the third lower electrode includes:
   a first portion having a cylindrical shape including a closed lower surface and an opened upper surface; and
   a second portion downwardly extended from the first portion of the third lower electrode, and
   wherein the third dielectric layer is disposed over the first portion of the third lower electrode.

8. A semiconductor device comprising:
   a first capacitor including a first lower electrode, a first upper electrode, and a first dielectric layer disposed between the first lower electrode and the first upper electrode at a first height; and
   a second capacitor spaced apart from the first capacitor, the second capacitor including a second lower electrode, a second upper electrode, and a second dielectric layer disposed between the second lower electrode and the second upper electrode at a second height different from the first height,
   wherein the first upper electrode includes:
   a first portion having a cylindrical shape including a closed upper surface and an opened lower surface; and
   a second portion upwardly extended from the first portion of the first upper electrode,
   wherein the first lower electrode includes:
   a first portion having a bar shape extended into the first portion of the first upper electrode; and
   a second portion downwardly extended from the first portion of the first lower electrode, and
   wherein the first dielectric layer is disposed between the first portion of the first upper electrode and the first portion of the first lower electrode.

9. A semiconductor device comprising:
a first capacitor and a second capacitor spaced apart from each other,
wherein each one of the first and second capacitors includes:
an upper electrode having a cylindrical portion with a closed upper surface and an opened lower surface, and a bar portion upwardly extended from the cylindrical portion, and
a lower electrode having a bar portion downwardly extended from the opened lower surface of the cylindrical portion,
wherein a dielectric layer is disposed on the respective cylindrical portions of the lower electrodes of the first and second capacitors, and
wherein the dielectric layer of each of the first and second capacitors are disposed at different heights of the semiconductor device.

* * * * *